(12) United States Patent
Huang

(10) Patent No.: US 12,374,384 B2
(45) Date of Patent: Jul. 29, 2025

(54) SIGNAL SAMPLING CIRCUIT AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 180 days.

(21) Appl. No.: 18/448,897

(22) Filed: Aug. 11, 2023

(65) Prior Publication Data

US 2023/0386557 A1    Nov. 30, 2023

Related U.S. Application Data

(63) Continuation of application No. PCT/CN2022/098889, filed on Jun. 15, 2022.

(30) Foreign Application Priority Data

Mar. 23, 2022 (CN) .......................... 202210291439.9

(51) Int. Cl.
    *G11C 11/4076*  (2006.01)
(52) U.S. Cl.
    CPC .................... *G11C 11/4076* (2013.01)
(58) Field of Classification Search
    CPC ..... G11C 11/4076; G11C 7/1087; G11C 8/18; G11C 7/109; G11C 7/1093; G11C 8/06;
    (Continued)

(56) References Cited

U.S. PATENT DOCUMENTS

| 10,679,683 B1 | 6/2020 | Chen |
| 2005/0007836 A1 | 1/2005 | Morzano |

(Continued)

FOREIGN PATENT DOCUMENTS

| CN | 1820322 A | 8/2006 |
| CN | 109584944 A | 4/2019 |

(Continued)

OTHER PUBLICATIONS

International Search Report in the international application No. PCT/CN2022/098889, mailed on Dec. 19, 2022. 7 pages with English translation.

(Continued)

*Primary Examiner* — Fernando Hidalgo
(74) *Attorney, Agent, or Firm* — SYNCODA LLC; Feng Ma

(57) ABSTRACT

A signal sampling circuit includes: a signal input circuit, configured to determine a to-be-processed command signal and a to-be-processed chip select signal; a clock processing circuit, configured to perform two-stage sampling and logical operation on the to-be-processed chip select signal according to a first clock signal to obtain a chip select clock signal; a chip select control circuit, configured to perform sampling on the to-be-processed chip select signal according to the first clock signal to obtain an intermediate chip select signal, and perform logical operations on the intermediate chip select signal, the to-be-processed chip select signal and the to-be-processed command signal to obtain a command decoding signal; and an output sampling circuit, configured to perform sampling on the command decoding signal according to the chip select clock signal to obtain a target command signal.

18 Claims, 12 Drawing Sheets

(58) Field of Classification Search
CPC ....... G11C 8/12; G11C 11/4082; G11C 29/12;
G11C 11/4063; Y02D 10/00
USPC .................................................... 365/233.13
See application file for complete search history.

(56) References Cited

U.S. PATENT DOCUMENTS

| | | |
|---|---|---|
| 2005/0254336 A1 | 11/2005 | Morzano |
| 2008/0056057 A1 | 3/2008 | Kim |
| 2008/0181031 A1 | 7/2008 | Morzano |
| 2017/0168746 A1* | 6/2017 | Kwon ...................... G11C 5/04 |
| 2019/0180803 A1 | 6/2019 | Jung |
| 2020/0005857 A1 | 1/2020 | Ito |
| 2020/0098405 A1 | 3/2020 | Momma |
| 2020/0176050 A1 | 6/2020 | Ito |
| 2023/0081627 A1 | 3/2023 | Li |

FOREIGN PATENT DOCUMENTS

| | | |
|---|---|---|
| CN | 109903793 A | 6/2019 |
| CN | 115798539 A | 3/2023 |
| JP | 2003179587 A | 6/2003 |
| KR | 100800483 B1 | 2/2008 |

OTHER PUBLICATIONS

Extended European Search Report in application No. 22932898, mailed on May 28, 2024.

\* cited by examiner

SIGNAL SAMPLING CIRCUIT AND SEMICONDUCTOR MEMORY

CROSS-REFERENCE TO RELATED APPLICATIONS

This is a continuation of International Patent Application No. PCT/CN2022/098889 filed on Jun. 15, 2022, which claims priority to Chinese Patent Application No. 202210291439.9 filed on Mar. 23, 2022. The disclosures of the above-referenced applications are hereby incorporated by reference in their entirety.

BACKGROUND

With the continuous development of semiconductor technology, there are increasing demands on data transmission speed in the manufacture and use of devices such as computers. In order to acquire faster data transmission speed, a series of devices such as memories where data can be transmitted at Double Data Rate (DDR) have emerged.

In a Dynamic Random Access Memory (DRAM), Command/Address (CMD/ADD, or abbreviated as CA) signals may be taken as addresses for sampling, and may also be taken as commands for sampling and decoding. In the related art, for a Non-Target On-Die Termination Command (NT ODT CMD) signal, as a chip select signal is at a low level in two consecutive clock cycles, erroneous decoding is prone to occur in the second clock cycle.

SUMMARY

The present disclosure relates to, but is not limited to, a signal sampling circuit and a semiconductor memory.

In a first aspect, embodiments of the present disclosure provide a signal sampling circuit, which includes a signal input circuit, a clock processing circuit, a chip select control circuit and an output sampling circuit.

The signal input circuit is configured to determine a to-be-processed command signal and a to-be-processed chip select signal according to a first clock signal, a first chip select signal and a first command address signal. A clock cycle of the first clock signal is twice a preset clock cycle.

The clock processing circuit is configured to perform two-stage sampling and logical operation on the to-be-processed chip select signal according to the first clock signal to obtain a chip select clock signal. The chip select clock signal includes two pulses and a pulse width of each of the pulses is the preset clock cycle.

The chip select control circuit is configured to perform sampling on the to-be-processed chip select signal according to the first clock signal to obtain an intermediate chip select signal, and perform logical operations on the intermediate chip select signal, the to-be-processed chip select signal and the to-be-processed command signal to obtain a command decoding signal.

The output sampling circuit is configured to perform sampling on the command decoding signal according to the chip select clock signal to obtain a target command signal.

In a second aspect, the embodiments of the present disclosure provide a semiconductor memory, which includes the signal sampling circuit as described in the first aspect.

DETAILED DESCRIPTION

The technical solutions in the embodiments of the present disclosure will be clearly and completely described below in conjunction with the accompanying drawings in the embodiments of the present disclosure. It is to be understood that the specific embodiments described herein are merely intended to explain the relevant application and not to limit the application. It should also be noted that, for ease of description, only portions related to the related application are shown in the accompanying drawings.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

In the following description, "some embodiments" involved describes a subset of all possible embodiments, but it is to be understood that "some embodiments" may be a same subset or different subsets of all possible embodiments and may be combined with each other without conflict.

It should be noted that the term "first\second\third" involved in the embodiments of the present disclosure is merely used to distinguish similar objects without representing a specific order for the objects. It is to be understood that "first\second\third" may be interchanged to specific sequences or orders if allowed to implement the embodiments of the disclosure described herein in sequences except the illustrated or described ones.

The following are the explanations of the technical terms and the correspondence of some nouns in the embodiments of the present disclosure:

Dynamic Random Access Memory (DRAM)
Synchronous Dynamic Random Access Memory (SDRAM)
Double Data Rate (DDR)
4th DDR (DDR4)
5th DDR (DDR5)
Command Address Input (CMD/ADD or abbreviated as CA)
Clock Input (CLK)
Chip Select Input (CS)
Buffer/Repeater (RPT)
On-Die Termination (ODT)
Command Decoder (CMD DEC)
Data Flip-Flop or Delay Flip-Flop (DFF)
2Tck Command (2T CMD)
Non-Target On-Die Termination Command (NT ODT CMD)

It is to be understood that, taking DDR5 DRAM design as an example, CA input may be taken as addresses for sampling, and may also be taken as commands for sampling and decoding. The CA herein is a general name for various command address signals of DRAM, which may include command signals such as Row Address Strobe (RAS), Column Address Strobe (CAS), Write (WE), Active (ACT), and also may include address signals of A13 to A0. In addition, in practical applications, the command address signals includes address signals of several bits, which may be specifically determined according to the specification of the DRAM, and are not limited in the embodiments of the present disclosure.

Figure 1:
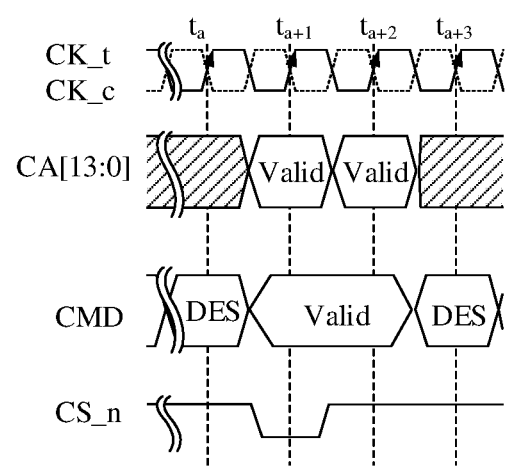
FIG. 1 is a schematic diagram of signal timing of two clock cycle commands.

In a 2T CMD mode of the DDR5 DRAM, FIG. 1 illustrates a schematic diagram of signal timing of two clock cycle commands. In FIG. 1, CK_t and CK_c are a pair of input complementary clock signals, CA [13:0] is CA signal input, CMD is a command signal obtained after decoding the CA signal, and CS_n is a chip select signal indicating that the CA signal is valid. As illustrated in FIG. 1, CA [13:0] is a signal that lasts two clock cycles. The CA in the first clock cycle and the CA in the second clock cycle need to be taken as address signals for sampling, while the CA in the first clock cycle also needs to be taken as command signals for sampling and decoding. Specifically, in the DDR5 DRAM, CA [4:0] of the first clock cycle is taken as command signals for sampling and decoding.

Figure 2:
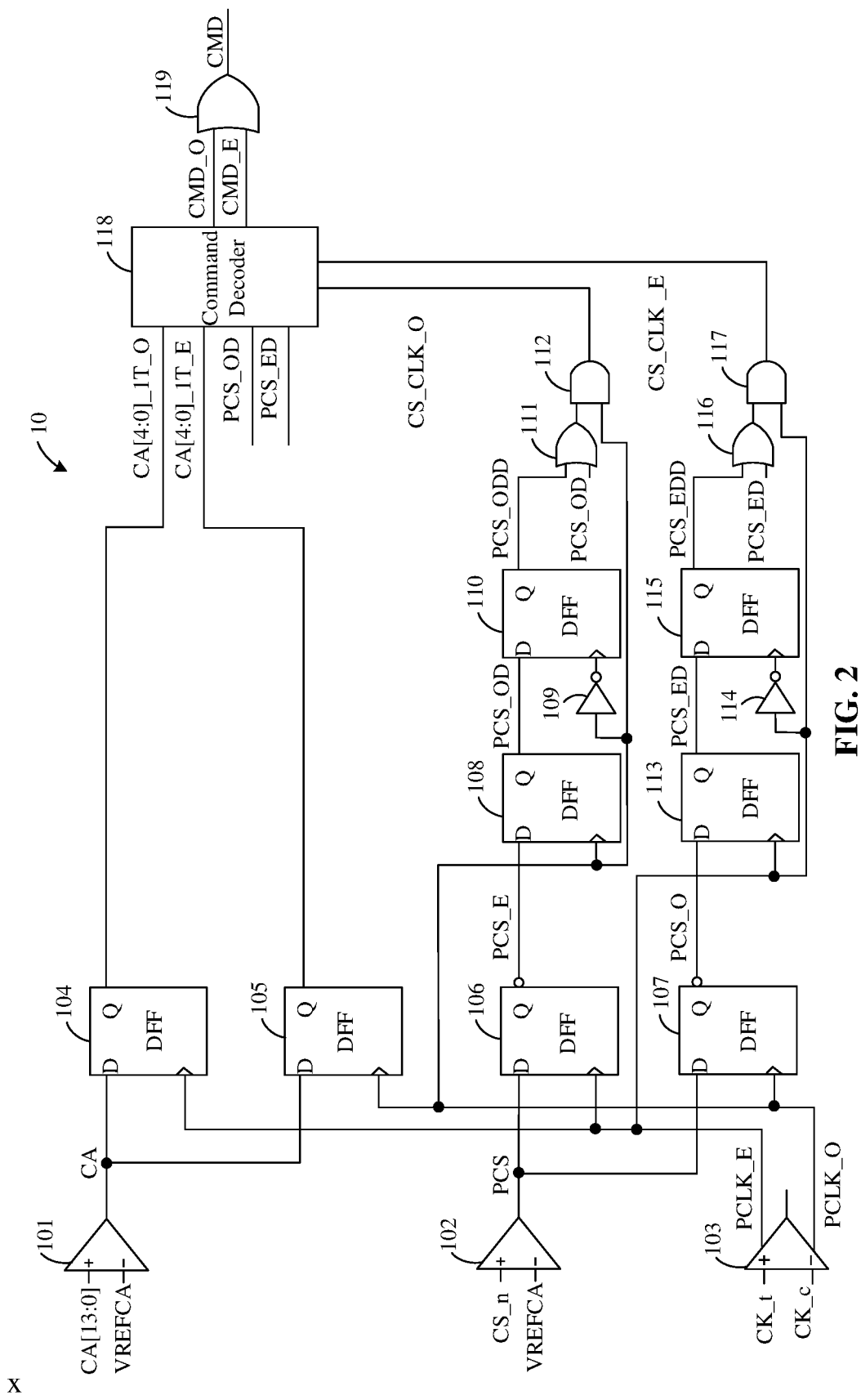
FIG. 2 is a schematic diagram of a composition structure of a signal sampling circuit.

Exemplarily, referring to FIG. 2, FIG. 2 illustrates a schematic diagram of a composition structure of a signal sampling circuit. As illustrated in FIG. 2, the signal sampling circuit 10 may include a first receiver 101, a second receiver 102, a third receiver 103, a first sampling circuit 104, a second sampling circuit 105, a third sampling circuit 106, a fourth sampling circuit 107, a fifth sampling circuit 108, a first inverter 109, a sixth sampling circuit 110, a first OR gate 111, a first AND gate 112, a seventh sampling circuit 113, a second inverter 114, an eighth sampling circuit 115, a second OR gate 116, a second AND gate 117, a CMD DEC 118 and a third OR gate 119. The first sampling circuit 104, the second sampling circuit 105, the fifth sampling circuit 108, the sixth sampling circuit 110, the seventh sampling circuit 113 and the eighth sampling circuit 115 may be composed of DFFs, and the third sampling circuit 106 and the fourth sampling circuit 107 may be composed of DFFs and inverters.

In FIG. 2, input signals of the first receiver 101 are an initial command address signal (represented by CA [13:0]) and a reference signal (represented by VREFCA), and an output signal is a first command address signal (represented by CA). Input signals of the second receiver 102 is an initial chip select signal (represented by CS_n) and a reference signal (represented by VREFCA), and an output signal is a first chip select signal (represented by PCS). Input signals of the third receiver 103 are a pair of input complementary clock signals (represented by CK_t and CK_c), and output signals are a first even clock signal (represented by PCLK_E) and a first odd clock signal (represented by PCLK_O). It should be noted that the third receiver 103 also has a frequency division processing capability, so that a frequency of each of the PCLK_E signal and the PCLK_O signal is one-half of a frequency of the CK_t signal or the CK_c signal, that is, a clock cycle of each of the PCLK_E signal and the PCLK_O signal is twice (two times) a clock cycle of the CK_t signal or the CK_c signal, with a phase difference of 180 degrees. In addition, it should be noted that CA [13:0] herein represents a set of signals, which is the general name of signals CA [0], CA [1], . . . , CA [13]. Accordingly, in FIG. 2, there are 14 first receivers 101, and there are also 14 corresponding subsequent sampling circuits (the first sampling circuits 104 and the second sampling circuits 105), which correspond one-to-one with CA [0], CA [1], . . . , CA [13]. In FIG. 2, only one first receiver 101, one first sampling circuit 104 and one second sampling circuit 105 are shown exemplarily.

Then, sampling is performed on the first command address signal by using the PCLK_E signal through the first sampling circuit 104, to obtain a second even command address signal (represented by CA[13:0]_1T_E), and the second even command address signal includes a to-be-processed even command signal (represented by CA[4:0]_1T_E). Sampling is performed on the first command address signal by using the PCLK_O signal through the second sampling circuit 105, to obtain a second odd command address signal (represented by CA[13:0]_1T_O), and the second odd command address signal includes a to-be-processed odd command signal (represented by CA[4:0]_1T_O). Sampling and inverting are performed on the first chip select signal by using the PCLK_E signal through the third sampling circuit 106, to obtain a to-be-processed even chip select signal (represented by PCS_E). Sampling and inverting are performed on the first chip select signal by using the PCLK_O signal through the fourth sampling circuit 107, to obtain a to-be-processed odd chip select signal (represented by PCS_O). In addition, it should be noted that CA[13:0]_1T_E is not one signal, but represents a set of signals, i.e., CA [13] _1T_E~CA[0]_1T_E, while CA[4:0]_1T_E signals are 5 signals in the CA[13:0]_1T_E signals, i.e., CA[0]_1T_E, CA [1] _1T_E, CA [2] _1T_E, CA [3]_1T_E and CA[4]_1T_E. CA [13:0] _1T_O is also not one signal, but represents a set of signals, i.e., CA [13] _1T_O~CA[0]_1T_O, while CA[4:0]_1T_O signals are 5 signals in the CA[13:0]_1T_O signals, i.e., CA[0]_1T_O, CA [1] _1T_O, CA [2] _1T_O, CA [3]_1T_O and CA[4]_1T_O.

Then, sampling is performed on the PCS_E signal by using a rising edge of the PCLK_O signal through the fifth sampling circuit 108, to obtain a first odd chip select sampling signal (represented by PCS_OD); and sampling is performed on the PCS_OD signal by using a falling edge of the PCLK_O signal through the first inverter 109 and the sixth sampling circuit 110, to obtain a second odd chip select sampling signal (represented by PCS_ODD). An OR logic operation is performed on the PCS_ODD signal and the PCS_OD signal through the first OR gate 111 to obtain an intermediate odd signal; and an AND logic operation is performed on the intermediate odd signal and the PCLK_O signal through the first AND gate 112 to obtain an odd chip select clock signal (represented by CS_CLK_O). Then, sampling is performed on the PCS_O signal by using a rising edge of the PCLK_E signal through the seventh sampling circuit 113, to obtain a first even chip select sampling signal (represented by PCS_ED); and sampling is performed on the PCS_ED signal by using a falling edge of the PCLK_E signal through the second inverter 114 and the eighth sampling circuit 115 to obtain a second even chip select sampling signal (represented by PCS_EDD). An OR logic operation is performed on the PCS_EDD signal and the PCS_ED signal through the second OR gate 116 to obtain an intermediate even signal; and an AND logic operation is performed on the intermediate even signal and the PCLK_E signal through the second AND gate 117 to obtain an even chip select clock signal (represented by CS_CLK_E).

Finally, decoding and sampling are performed on the CA[4:0]_1T_E, the CA[4:0]_1T_O, the PCS_E and the PCS_O signals by using the CS_CLK_E signal and the CS_CLK_O signals through the CMD DEC 118 to obtain an even command signal (represented by CMD_E) and an odd command signal (represented by CMD_O); and an OR logic operation is performed on the CMD_E signal and the CMD_O signal through the third OR gate 119 to obtain a target command signal (represented by CMD).

Figure 3:
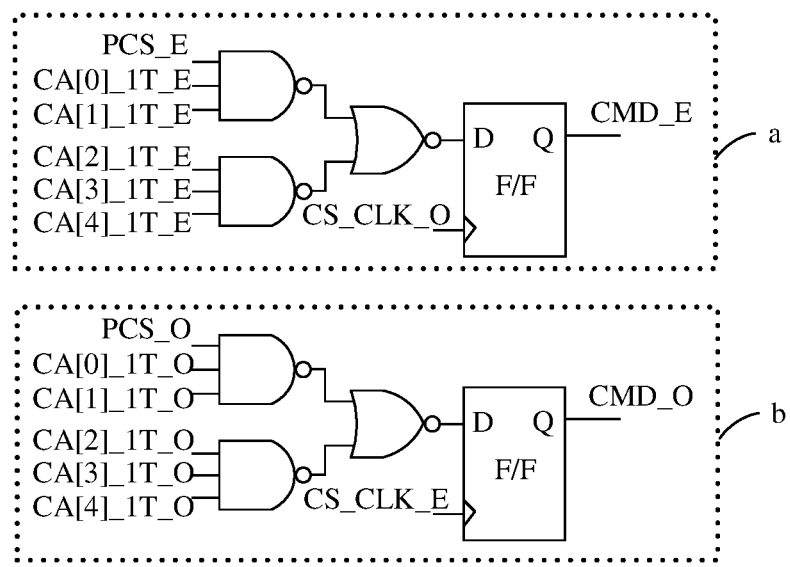
FIG. 3 is a schematic diagram of a composition structure of a command decoder.

It should be noted that the CMD DEC 118 may also be referred to as a command decoding trigger, which is represented by CMD DEC DFF. Referring to FIG. 3, the CMD DEC may include a first command decoding circuit a and a second command decoding circuit b. Details are illustrated in FIG. 3, each of the first command decoding circuit a and the second command decoding circuit b may be composed of logic components such as two three-input NAND gates, a two-input NOR gate and a DFF.

Figure 4:
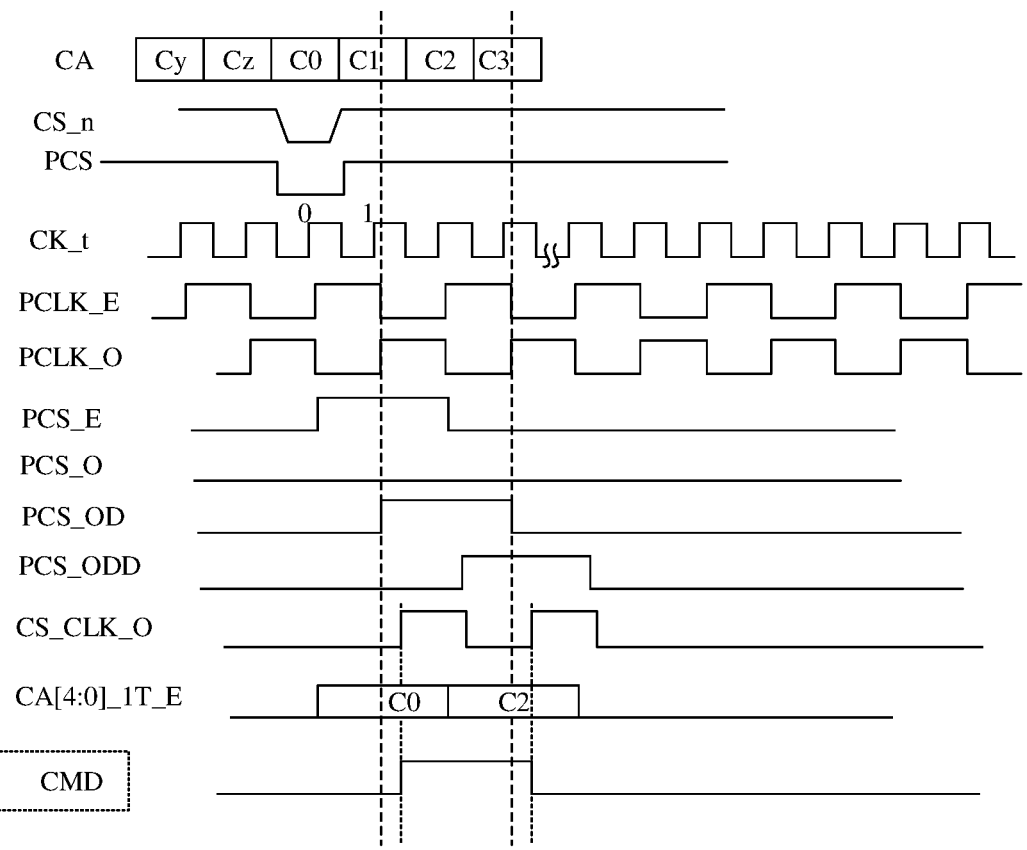
FIG. 4 is a first schematic diagram of signal timing of a signal sampling circuit.

It should also be noted that assuming the initial chip select signal is sampled in a rising edge of an even clock cycle to be at a low level, signal timing corresponding to the signal sampling circuit 10 in FIG. 2 is illustrated in FIG. 4. In FIG. 4, the first command address signal is represented by CA, and the CA may include Cy, Cz, C0, C1, C2, and C3. The initial chip select signal is represented by CS_n, and the CS_n is a signal indicating that a target chip is selected. The first chip select signal is represented by PCS, and the PCS is an active-low pulse signal and has a pulse width of a preset clock cycle. The description of other signals may refer to the above contents. Herein, the even clock cycle or the odd clock cycle refers to the clock cycle of the initial clock signal CK_t/CK_c.

Specifically, after frequency division is performed through the third receiver 103, a PCLK_E signal and a PCLK_O signal may be obtained. Then, a rising edge of the PCLK_E signal is taken as a start of the even clock cycle, and a rising edge of the PCLK_O signal is taken as a start of the odd clock cycle. The clock cycle of the CK_t/CK_c is the preset clock cycle, and the clock cycles of the PCLK_E signal and the PCLK_O signal are both twice the preset clock cycle. In this way, after the CA signal is sampled by using the rising edge of the PCLK_E signal, the CA[4:0]_1T_E signal including C0 and C2 information is obtained. After first-stage sampling and inverting are performed on the PCS signal by using the rising edge of PCLK_O signal, the PCS_O signal is obtained, and the PCS_O signal is a low-level signal. However, after first-stage sampling and inverting are performed on the PCS signal by using the rising edge of PCLK_O signal, the PCS_E signal is obtained, and the PCS_E signal is an active-high pulse signal and has a pulse width of twice the preset clock cycle. Then, after second-stage sampling is performed on the PCS_E signal by using the rising edge of the PCLK_O signal, the PCS_OD signal is obtained, and the PCS_OD signal is also an active-high pulse signal and has a pulse width of twice the preset clock cycle, but the PCS_OD signal is delayed by one preset clock cycle compared with the PCS_E signal. Then, after third-stage sampling is performed on the PCS_OD signal by using the falling edge of PCLK_O signal, the PCS_ODD signal is obtained, and the PCS_ODD signal is also an active-high pulse signal and has a pulse width of twice the preset clock cycle, but the PCS_ODD signal is delayed by two preset clock cycles compared with the PCS_E signal. In this way, logic operations are performed on the PCS_ODD signal, the PCS_OD signal and the PCLK_O signal through the first OR gate 111 and the first AND gate 112 to obtain a CS_CLK_O signal. The CS_CLK_O signal is also an active-high pulse signal and has two pulses, and each pulse has a pulse width of the preset clock cycle. In addition, the CMD signal obtained through the CMD DEC 118 and the third OR gate 119 is also an active-high pulse signal and has a pulse width of twice the preset clock cycle. A rising edge of a first pulse of the CS_CLK_O signal is used to generate a rising edge of the CMD signal, and a rising edge of a second pulse of the CS_CLK_O signal is used to generate a falling edge of the CMD signal.

Figure 5:
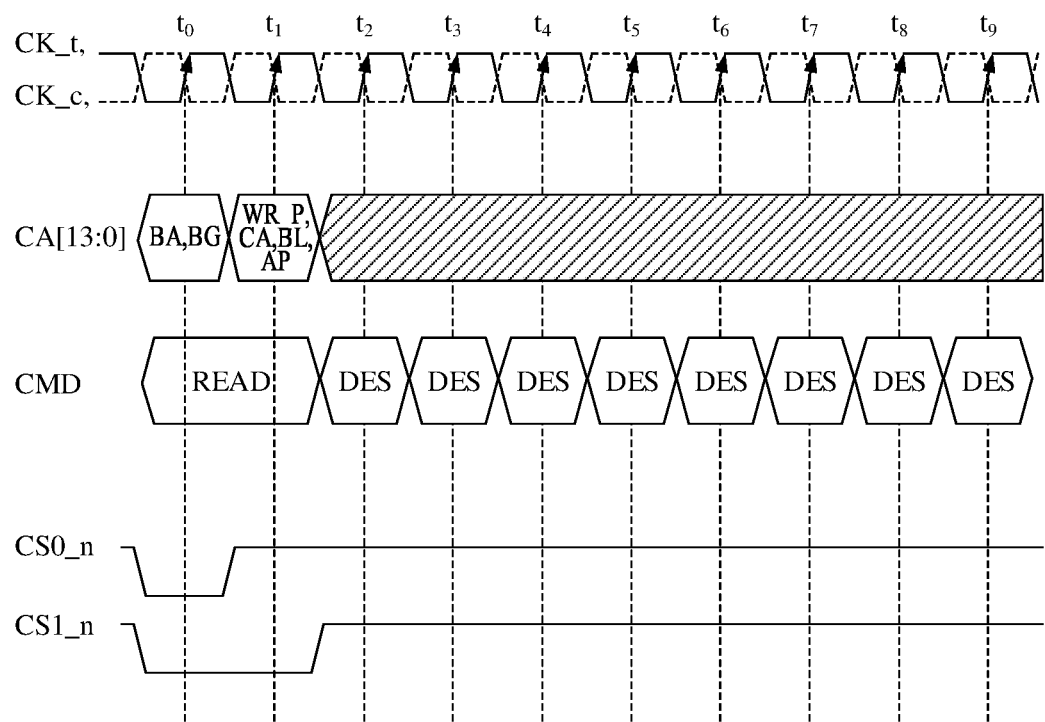
FIG. 5 is a schematic diagram of comparison of two chip select signals with different pulse widths.

However, there are two kinds of command signals in DDR5: a 2T CMD signal and a NT ODT CMD signal. The 2T CMD signal may also be referred to as 2-cycle Command signal. As illustrated in FIG. 5, for the 2T CMD signal, the corresponding chip select signal is represented by CS0_n and has a pulse width of the preset clock cycle; and for the NT ODT CMD signal, the corresponding chip select signal is represented by CS1_n, and has a pulse width of twice the preset clock cycle. The decoding timing of such two signals will be described below in combination with the signal sampling circuit 10.

Figure 6:
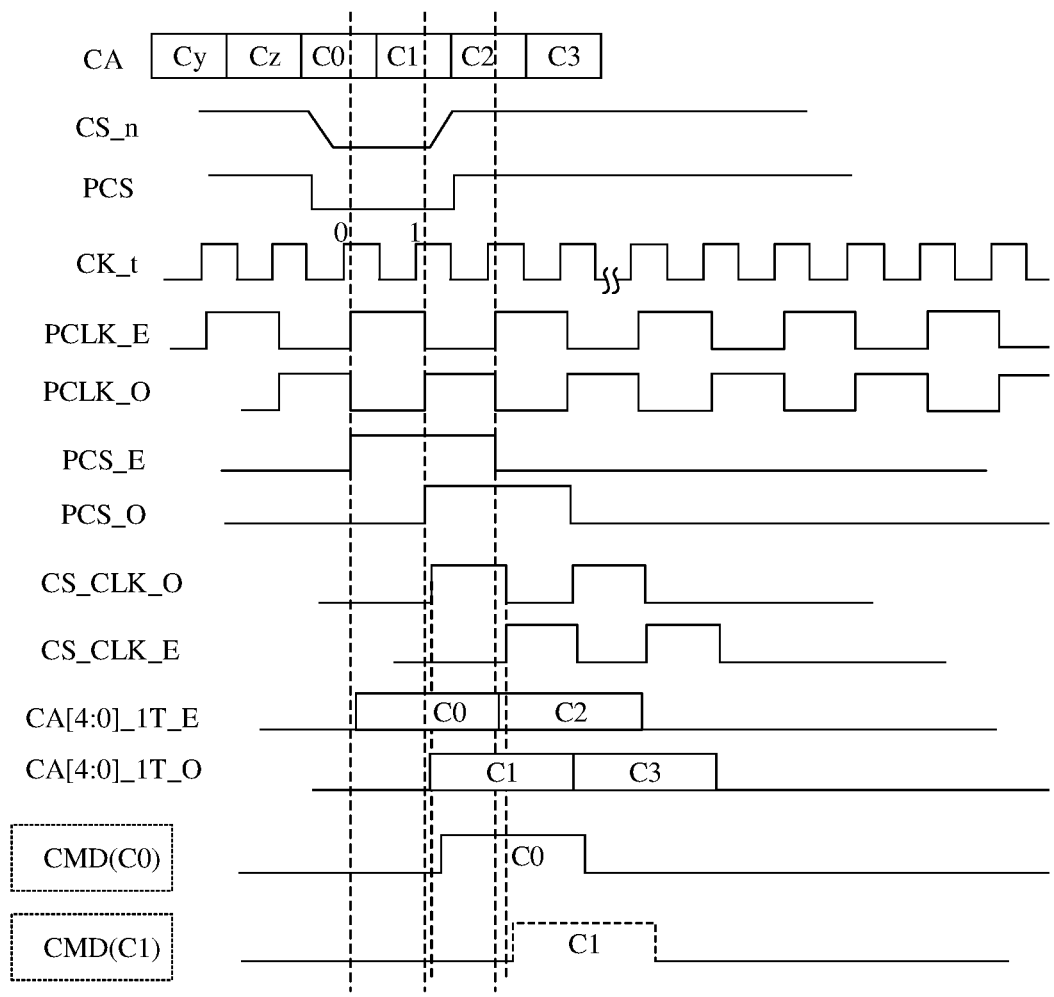
FIG. 6 is a second schematic diagram of signal timing of a signal sampling circuit.

Referring to FIG. 6, another schematic diagram of signal timing corresponding to a signal sampling circuit 10 is illustrated. As illustrated in FIG. 6, the first command address signal is represented by CA, and the CA may include Cy, Cz, C0, C1, C2, and C3. The initial chip select signal is represented by CS_n, and the CS_n is a signal indicating that a target chip is selected. The first chip select signal is represented by PCS, and the PCS is an active-low pulse signal and has a pulse width of twice the preset clock cycle. The description of other signals may refer to the above contents.

Specifically, after frequency division is performed through the third receiver 103, a PCLK_E signal and a PCLK_O signal may be obtained. Then, a rising edge of the PCLK_E signal is taken as a start of the even clock cycle, and a rising edge of the PCLK_O signal is taken as a start of the odd clock cycle. The clock cycle of the CK_t/CK_c is the preset clock cycle, and the clock cycles of the PCLK_E signal and the PCLK_O signal are both twice the preset clock cycle. In this way, after the CA signal is sampled by using the rising edge of the PCLK_E signal, the CA [4:0]_1T_E signal including C0 and C2 information is obtained, and after the CA signal is sampled by using the rising edge of PCLK_O signal, the CA [4:0]_1T_O signal including C1 and C3 information is obtained. After first-stage sampling and inverting are performed on the PCS signal by using the rising edge of the PCLK_E signal, the obtained PCS_E signal is an active-high pulse signal and has a pulse width of twice the preset clock cycle. After first-stage sampling and inverting are performed on the PCS signal by using the rising edge of the PCLK_O signal, the obtained PCS_O signal is an active-high pulse signal and has a pulse width of twice the preset clock cycle, but the PCS_O signal is delayed by one preset clock cycle compared with the PCS_E signal. Then, second-stage and third-stage sampling and logic operations are performed on the PCS_E signal by using the PCLK_O signal to obtain a CS_CLK_O signal. The CS_CLK_O signal is an active-high pulse signal and has two pulses, and each pulse has a pulse width of the preset clock cycle. Then, second-stage and third-stage sampling and logic operations are performed on the PCS_O signal by using the PCLK_E signal to obtain a CS_CLK_E signal. The CS_CLK_E signal is an active-high pulse signal and has two pulses, each of the pulses has a pulse width of the preset clock cycle, but the CS_CLK_E signal is delayed by one preset clock cycle compared with the CS_CLK_O signal. In such case, the CMD signal obtained through the CMD DEC 118 and the third OR gate 119 may have two decoding results: one decoding result is C0 information and the other decoding result is C1 information. The C0 information is obtained by performing sampling on the decoding of the CA[4:0]_1T_E signal with the CS_CLK_O signal, and the C1 information is obtained by performing sampling on the decoding of the CA[4:0]_1T_O signal with the CS_CLK_E signal.

It should be noted that, FIG. 6 should correspond to decoding of a NT ODT CMD signal, but may be mistaken for decoding of a 2T CMD signal. In simple terms, after two-stage sampling and logic operations are performed on the PCS_E signal through the PCLK_O signal, the CS_CLK_O signal is obtained, and after two-stage sampling and logic operations are performed on the PCS_O signal through the PCLK_E signal, the CS_CLK_E signal is obtained, and then the decoding of CA[4:0]_1T_E/CA[4:0]_1T_O signal is sampled according to the CS_CLK_O/CS_CLK_E signal, so that the CMD signal with one pulse may be generated. However, the decoding of the 2T CMD signal needs to parse the input that the CS_n signal is at a low level in the first clock cycle and is at a high level in the second clock cycle; but the decoding of the NT ODT CMD signal needs to parse the input that the CS_n signal are at a low level in two consecutive clock cycles. In this way, if CA [13:0] is a normal command address input, the second clock cycle of the CS_n signal corresponding to the NT ODT CMD signal may be mistaken for the first clock cycle of the CS_n signal corresponding to the 2T CMD signal, so C1 may be decoded into a 2T CMD signal, which results in erroneous decoding of the NT ODT CMD.

Based on this, embodiments of the present disclosure provide a signal sampling circuit, which includes a signal input circuit, a clock processing circuit, a chip select control circuit and an output sampling circuit. The signal input circuit is configured to determine a to-be-processed command signal and a to-be-processed chip select signal according to a first clock signal, a first chip select signal and a first command address signal. A clock cycle of the first clock signal is twice a preset clock cycle. The clock processing circuit is configured to perform two-stage sampling and logical operation on the to-be-processed chip select signal according to the first clock signal to obtain a chip select clock signal. The chip select clock signal includes two pulses and a pulse width of each of the pulses is the preset clock cycle. The chip select control circuit is configured to perform sampling on the to-be-processed chip select signal according to the first clock signal to obtain an intermediate chip select signal, and perform logical operation on the intermediate chip select signal, the to-be-processed chip select signal and the to-be-processed command signal to obtain a command decoding signal. The output sampling circuit is configured to perform sampling on the command decoding signal according to the chip select clock signal to obtain a target command signal. In this way, based on the signal sampling circuit, for the decoding of the two commands 2T CMD and NT ODT CMD, the correct decoding of the 2T CMD signal and the NT ODT CMD signal may be ensured through the chip select control circuit, thereby avoiding erroneous decoding for the second clock cycle of the NT ODT CMD signal and improving the accuracy of commands decoding.

Embodiments of the present disclosure will be described in detail below with reference to the accompanying drawings.

Figure 7:
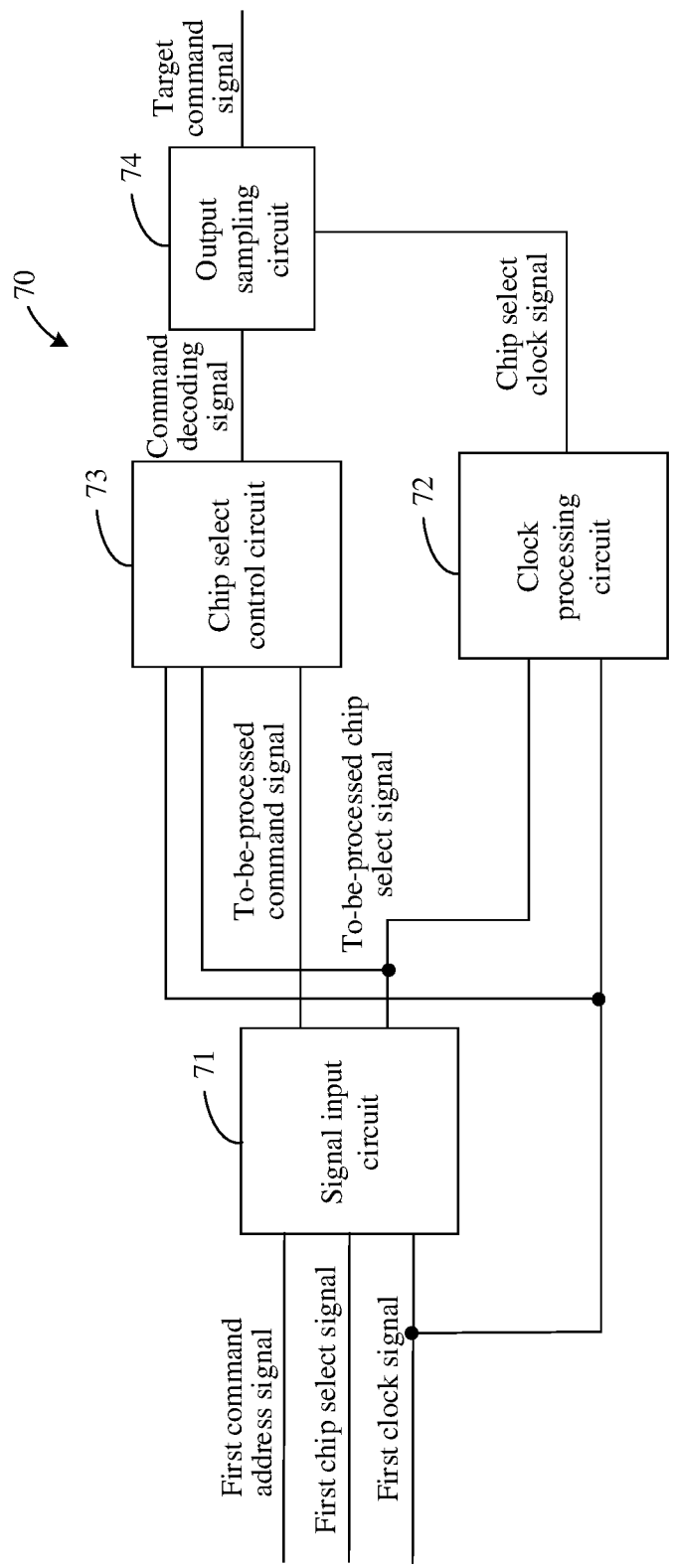
FIG. 7 is a first schematic diagram of a composition structure of a signal sampling circuit according to an embodiment of the present disclosure.

In an embodiment of the present disclosure, referring to FIG. 7, a first schematic diagram of a composition structure of a signal sampling circuit according to an embodiment of the present disclosure is illustrated. As illustrated in FIG. 7, the signal sampling circuit 70 may include a signal input circuit 71, a clock processing circuit 72, a chip select control circuit 73 and an output sampling circuit 74.

The signal input circuit 71 is configured to determine a to-be-processed command signal and a to-be-processed chip select signal according to a first clock signal, a first chip select signal and a first command address signal. A clock cycle of the first clock signal is twice a preset clock cycle.

The clock processing circuit 72 is configured to perform two-stage sampling and logical operation on the to-be-processed chip select signal according to the first clock signal to obtain a chip select clock signal. The chip select clock signal includes two pulses and a pulse width of each of the pulses is the preset clock cycle.

The chip select control circuit 73 is configured to perform sampling on the to-be-processed chip select signal according to the first clock signal to obtain an intermediate chip select signal, and perform logical operation on the intermediate chip select signal, the to-be-processed chip select signal and the to-be-processed command signal to obtain a command decoding signal.

The output sampling circuit 74 is configured to perform sampling on the command decoding signal according to the chip select clock signal to obtain a target command signal.

It should be noted that, in the embodiments of the present disclosure, the signal sampling circuit 70 is applied to the sampling and decoding process of the address and command signals, which may specifically be applied in a variety of circuit scenarios. The embodiments of the present disclosure are described below by performing sampling and decoding of addresses and commands on CA signals in a DRAM chip, but does not constitute relevant limitation.

It should also be noted that, in the embodiments of the present disclosure, the signal sampling circuit 70 may be applied to a 2T CMD scenario. Specifically, in this scenario, as illustrated in FIG. 1 for details, the first command address signal includes a valid signal with two preset clock cycles, and the valid pulse of the target command signal (represented by CMD) also lasts for two preset clock cycles. In FIG. 1, the CS_n signal is an active-low pulse signal, and the CA[13:0] signals corresponding to a current clock cycle and a next adjacent clock cycle are valid. The current clock cycle is a clock cycle in which the CS_n signal is a low level pulse. In addition, it should be noted that, the preset clock cycle here refers to the clock cycle of the CK_t/CK_c signal, while the CS_n signal is a signal indicating that a target chip is selected, and CA[13:0] is not a signal, but represents a set of command address signals, that is, a total of 14 signals CA[0]~CA[13].

It should also be noted that, in the embodiments of the present disclosure, the target command signal may be a Command signal in the DDR5 DRAM chip. Since the valid pulse of the signal lasts for two clock cycles, it may be referred to as a 2T CMD signal for short. The Command signal may include a read command signal, a write command signal, a refresh command signal, a pre-charge command signal and an active command signal and the like. Alternatively, the target command signal may also be a Non-Target ODT Command signal in the DDR5 DRAM chip, which may be referred to as NT ODT CMD signal for short.

In order to avoid erroneous decoding for the second clock cycle of the NT ODT CMD signal, the embodiments of the present disclosure mainly adds the chip select control circuit 73. Sampling is performed on the to-be-processed chip select signal according to the first clock signal, a CS_n signal sampled in the previous clock cycle may be saved, and then the AND logical output of the CS_n signal sampled in the previous clock cycle and a CS_n signal sampled in the current clock cycle is used as the input of command decoding, that is, the CS_n signal sampled in the previous clock cycle is used for logic check, so as to ensure the correct decoding of the 2T CMD signal and the NT ODT CMD signal and enhance the accuracy of commands decoding.

Figure 8:
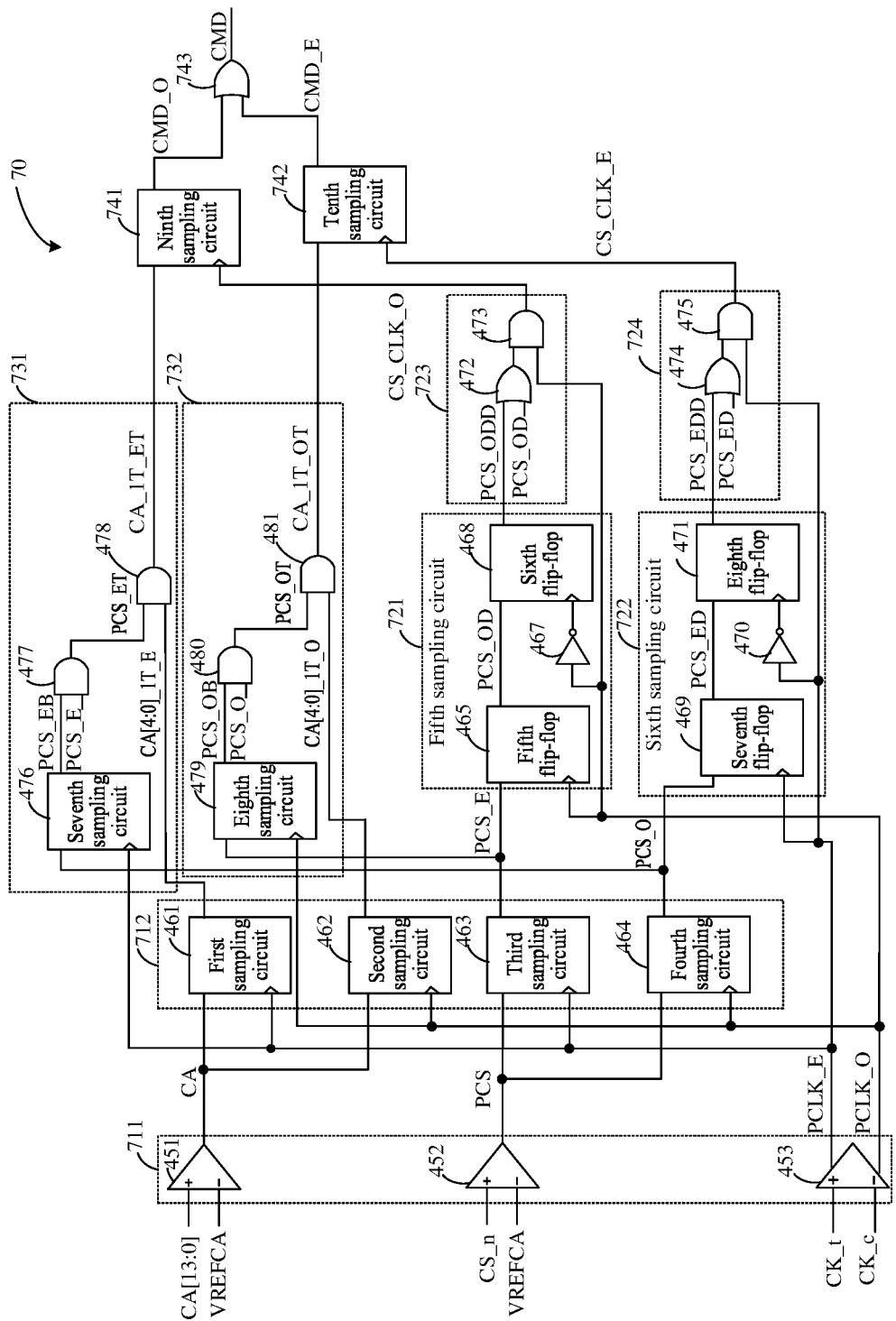
FIG. 8 is a second schematic diagram of a composition structure of a signal sampling circuit according to an embodiment of the present disclosure.

In some embodiments, based on the signal sampling circuit 70 illustrated in FIG. 7, as illustrated in FIG. 8, the signal input circuit 71 may include a receiving circuit 711 and an input sampling circuit 712.

The receiving circuit 711 is configured to receive an initial command address signal, an initial chip select signal and an initial clock signal, and output the first command address signal, the first chip select signal and the first clock signal.

The input sampling circuit 712 is configured to perform sampling on the first chip select signal and the first command address signal according to the first clock signal, to obtain the to-be-processed command signal and the to-be-processed chip select signal.

Here, a clock cycle of the initial clock signal is the preset clock cycle, and the clock cycle of the first clock signal is twice the preset clock cycle. That is, the first clock signal is obtained by performing frequency division on the initial clock signal.

In a particular embodiment, as illustrated in FIG. 8, the receiving circuit 711 may include a first receiving circuit 451, a second receiving circuit 452 and a third receiving circuit 453.

The first receiving circuit 451 is configured to receive the initial command address signal and output the first command address signal.

The second receiving circuit 452 is configured to receive the initial chip select signal and output the first chip select signal.

The third receiving circuit 453 is configured to receive the initial clock signal and perform frequency division on the initial clock signal, to output a first odd clock signal and a first even clock signal.

The first clock signal may be composed of the first odd clock signal and the first even clock signal, a clock cycle of each of the first odd clock signal and the first even clock signal is twice the preset clock cycle, and a phase difference between the first odd clock signal and the first even clock signal is 180 degrees.

In addition, it should be noted that, in the embodiments of the present disclosure, any of the first receiving circuit 451, the second receiving circuit 452 and the third receiving circuit 453 may be a receiver (represented by Receiver) or a buffer (represented by Buffer).

It should also be noted that, in the embodiments of the present disclosure, the initial command address signal here may be represented by CA [13:0], the first command address signal may be represented by CA; the initial chip select signal may be represented by CS_n, the first chip select signal may be represented by PCS; the initial clock signal may be represented by CK_t and CK_c, the first even clock signal is represented by PCLK_E, and the first odd clock signal is represented by PCLK_O. For the PCLK_E signal and the PCLK_O signal, a clock cycle of the PCLK_E signal is twice the preset clock cycle, a clock cycle of the PCLK_O signal is also twice the preset clock cycle, and a phase difference between the PCLK_E signal and the PCLK_O signal is 180 degrees.

It should also be noted that, in the embodiments of the present disclosure, either the initial command address signal or the first command address signal is not one signal, but represents a set of command address signals, i.e., CA[0]~CA[13]. Therefore, the first receiving circuit 451 may include 14 receiving circuits for receiving 14 signals CA[0], CA[1], . . . , CA[13], and only one receiving circuit is illustrated in FIG. 8 as a schematic illustration.

In addition, for the input sampling circuit 712, the embodiments of the present disclosure requires not only to perform sampling on the first command address signal by using the first clock signal, but also to perform sampling on the first chip select signal by using the first clock signal. Thus, in some embodiments, as illustrated in FIG. 8, the input sampling circuit 712 may include a first sampling circuit 461, a second sampling circuit 462, a third sampling circuit 463, and a fourth sampling circuit 464.

The first sampling circuit 461 is configured to perform sampling on the first command address signal according to the first even clock signal to obtain a to-be-processed even command signal.

The second sampling circuit 462 is configured to perform sampling on the first command address signal according to the first odd clock signal to obtain a to-be-processed odd command signal.

The third sampling circuit 463 is configured to perform sampling and inverting on the first chip select signal according to the first even clock signal, to obtain a to-be-processed even chip select signal.

The fourth sampling circuit 464 is configured to perform sampling and inverting on the first chip select signal according to the first odd clock signal, to obtain an to-be-processed odd chip select signal.

Here, the to-be-processed command signal is composed of the to-be-processed even command signal and the to-be-processed odd command signal, and the to-be-processed chip select signal is composed of the to-be-processed even chip select signal and the to-be-processed odd chip select signal.

It should be noted that, in a specific embodiment, the first sampling circuit 461 may include a first flip-flop, an input end of the first flip-flop is connected with the first command address signal, a clock end of the first flip-flop is connected with the first even clock signal, and an output end of the first flip-flop is used for outputting the to-be-processed even command signal. The second sampling circuit 462 may include a second flip-flop, an input end of the second flip-flop is connected with the first command address signal, a clock end of the second flip-flop is connected with the first odd clock signal, and an output end of the second flip-flop is used for outputting the to-be-processed odd command signal. The third sampling circuit 463 may include a third flip-flop and a first inverter, an input end of the third flip-flop is connected with the first chip select signal, a clock end of the third flip-flop is connected with the first even clock signal, an output end of the third flip-flop is connected with an input end of the first inverter, and an output end of the first inverter is used for outputting the to-be-processed even chip select signal. The fourth sampling circuit 464 may include a fourth flip-flop and a second inverter, an input end of the fourth flip-flop is connected with the first chip select signal, a clock end of the fourth flip-flop is connected with the first odd clock signal, an output end of the fourth flip-flop is connected with an input end of the second inverter, and an output end of the second inverter is used for outputting the to-be-processed odd chip select signal.

That is, the first sampling circuit 461 and the second sampling circuit 462 are configured to perform sampling on the first command address signal by using the first clock signal. Specifically, the first sampling circuit 461 performs sampling on the first command address signal by using the first even clock signal to obtain the to-be-processed even command address signal, so as to obtain the to-be-processed even command signal from the to-be-processed even command address signal. The second sampling circuit 462 performs sampling on the first command address signal by using the first odd clock signal to obtain the to-be-processed odd command address signal, so as to obtain the to-be-processed odd command signal from the to-be-processed odd command address signal.

In the embodiments of the present disclosure, the to-be-processed command address signal may be composed of the to-be-processed even command address signal and the to-be-processed odd command address signal, and the to-be-processed command signal may be composed of the to-be-processed even command signal and the to-be-processed odd command signal. The to-be-processed even command address signal includes the to-be-processed even command signal and is represented by CA[13:0]_1T_E, and the to-be-processed even command signal is represented by CA[4:0]_1T_E. The to-be-processed odd command address signal includes the to-be-processed odd command signal and is represented by CA[13:0]_1T_O, and the to-be-processed odd command signal is represented by CA[4:0]_1T_O. It should be noted that CA[13:0]_1T_E is not one signal, but represents a set of command address signals, i.e., CA[0]_1T_E~CA[13]_1T_E, while CA[4:0]_1T_E represents five signals in this set of signals, i.e., CA[0]_1T_E~CA[4]_1T_E. CA[13:0]_1T_O is not a signal, but represents a set of command address signals, i.e., CA[0]_1T_O~CA[13]_1T_O, while CA[4:0]_1T_O represents five signals in this set of signals, i.e., CA[0]_1T_O~CA[4]_1T_O.

It may be understood that, for the first sampling circuit 461 and the second sampling circuit 462, both the first flip-flop and the second flip-flop may be DFFs. For the first sampling circuit 461, a clock end of the DFF is connected with the PCLK_E signal, an input end of the DFF is connected with the CA signal, an output end of the DFF is used for outputting the CA[13:0]_1T_E signals, in which the CA[4:0]_1T_E signals are composed of the to-be-processed even command signal. For the second sampling circuit 462, a clock end of the DFF is connected with the PCLK_O signal, an input end of the DFF is connected with the CA signal, an output end of the DFF is used for outputting the CA[13:0]_1T_O signals, in which the CA[4:0]_1T_O signals are composed of the to-be-processed odd command signal. It should also be noted that, for the first sampling circuit 461 or the second sampling circuit 462, since CA is not one signal, but a general name of a set of signals, there may be multiple first sampling circuits 461 for receiving each CA signal in the set of CA signals, respectively. Similarly, there may be multiple second sampling circuits 462 for receiving each CA signal in the set of CA signals, respectively. Only one first sampling circuit 461 and one second sampling circuit 462 are illustrated in FIG. 8 as a schematic illustration.

In addition, it should be noted that, the third sampling circuit 463 and the fourth sampling circuit 464 are configured to perform sampling on the first chip select signal by using the first clock signal. Specifically, the third sampling circuit 463 performs sampling and inverting on the first chip select signal by using the first even clock signal, to obtain the to-be-processed even chip select signal. The fourth sampling circuit 464 performs sampling and inverting on the first chip select signal by using the first odd clock signal, to obtain the to-be-processed odd chip select signal.

In the embodiments of the present disclosure, the to-be-processed chip select signal may be composed of the to-be-processed even chip select signal and the to-be-processed odd chip select signal. The first chip select signal is represented by PCS, the to-be-processed even chip select signal is represented by PCS_E, and the to-be-processed odd chip select signal is represented by PCS_O.

It is also understood that, for the third sampling circuit 463, the third flip-flop may also be a DFF, that is, the third sampling circuit 463 may be composed of the DFF and the first inverter. A clock end of the DFF is connected with the PCLK_E signal, an input end of the DFF is connected with the PCS signal, an output end of the DFF is connected with an input end of the first inverter, and an output end of the first inverter is used for outputting the PCS_E signal. For the fourth sampling circuit 464, the fourth flip-flop may also be a DFF, that is, the fourth sampling circuit 464 may be composed of the DFF and the second inverter. A clock end of the DFF is connected with the PCLK_O signal, an input end of the DFF is connected with the PCS signal, an output end of the DFF is connected with an input end of the second inverter, and an output end of the second inverter is used for outputting the PCS_O signal. Here, it should also be noted that since the PCS signal is an active-low pulse signal, after the first inverter or the second inverter is added, the PCS_O signal or the PCS_E signal may become an active-high pulse signal for subsequent logical operations. In addition, for subsequent different logical operations, the third sampling circuit 463 and the fourth sampling circuit 464 may not need to set the first inverter and the second inverter, and the subsequent logical operations need to be adjusted accordingly, so that the same effect may be achieved.

Thus, through the receiving circuit 711 and the input sampling circuit 712, the PCLK_E signal, the PCLK_O signal, the PCS_E signal, the PCS_O signal, the CA[4:0]_1T_E signals and the CA[4:0]_1T_O signals may be obtained. Then, the correct decoding of the 2T CMD signal and the NT ODT CMD signal may be ensured through the clock processing circuit 72 and the chip select control circuit 73, that is, by performing logic check using the CS_n signal sampled in the previous clock cycle, thereby avoiding erroneous decoding for the second clock cycle of the NT ODT CMD signal and enhancing the accuracy of commands decoding.

In some embodiments, based on the signal sampling circuit 70 illustrated in FIG. 7, as illustrated in FIG. 8, the clock processing circuit 72 may include a fifth sampling circuit 721, a sixth sampling circuit 722, a first logic circuit 723 and a second logic circuit 724.

The fifth sampling circuit 721 is configured to perform first-stage sampling on the to-be-processed even chip select signal by using the first odd clock signal to obtain a first odd chip select sampling signal, and perform second-stage sampling on the first odd chip select sampling signal by using the first odd clock signal to obtain a second odd chip select sampling signal.

The sixth sampling circuit 722 is configured to perform first-stage sampling on the to-be-processed odd chip select signal by using the first even clock signal to obtain a first even chip select sampling signal, and perform second-stage sampling on the first even chip select sampling signal by using the first even clock signal to obtain a second even chip select sampling signal.

The first logic circuit 723 is configured to perform logical operation(s) on the first odd clock signal, the first odd chip select sampling signal and the second odd chip select sampling signal to obtain an odd chip select clock signal.

The second logic circuit 724 is configured to perform logical operation(s) on the first even clock signal, the first even chip select sampling signal and the second even chip select sampling signal to obtain an even chip select clock signal.

Here, the chip select clock signal may be composed of the even chip select clock signal and the odd chip select clock signal. The even chip select clock signal may be represented by CS_CLK_E, and the odd chip select clock signal may be represented by CS_CLK_O.

It should be noted that, in the embodiments of the present disclosure, the fifth sampling circuit 721 may include two stages of sampling processing. The first-stage sampling may be a rising edge sampling processing, and the second-stage sampling may be a falling edge sampling processing.

It should also be noted that, in the embodiments of the present disclosure, for the fifth sampling circuit 721, in a specific embodiment, as illustrated in FIG. 8, the fifth sampling circuit 721 may include a fifth flip-flop 465, a first NOT gate 467 and a sixth flip-flop 468.

An input end of the fifth flip-flop 465 is connected with the to-be-processed even chip select signal, a clock end of the fifth flip-flop 465 is connected with the first odd clock signal, and an output end of the fifth flip-flop 465 is used for outputting the first odd chip select sampling signal. An input end of the sixth flip-flop 468 is connected with the output end of the fifth flip-flop 465, an input end of the first NOT gate 467 is connected with the first odd clock signal, an output end of the first NOT gate 467 is connected with a clock end of the sixth flip-flop 468, and an output end of the sixth flip-flop 468 is used for outputting the second odd chip select sampling signal.

That is, in the fifth sampling circuit 721, the fifth flip-flop 465, as the first-stage sampling, may perform first-stage sampling on the to-be-processed even chip select signal by using the rising edge of the first odd clock signal, to obtain the first odd chip select sampling signal. The first NOT gate 467 and the sixth flip-flop 468, as second-stage sampling, may perform inverting on the first odd clock signal through the first NOT gate 467, so as to perform second-stage sampling on the first odd chip select sampling signal by using the falling edge of the first odd clock signal to obtain the second odd chip select sampling signal. The first odd chip select sampling signal may be represented by PCS_OD, and the second odd chip select sampling signal may be represented by PCS_ODD.

It should be noted that, in the embodiments of the present disclosure, the sixth sampling circuit 722 may also include two stages of sampling processing. The first-stage sampling may be a rising edge sampling processing, and the second-stage sampling process may be a falling edge sampling processing.

It should also be noted that, in the embodiments of the present disclosure, for the sixth sampling circuit 722, in a specific embodiment, as illustrated in FIG. 8, the sixth sampling circuit 722 may include a seventh flip-flop 469, a second NOT gate 470 and an eighth flip-flop 471.

An input end of the seventh flip-flop 469 is connected with the to-be-processed odd chip select signal, a clock end of the seventh flip-flop 469 is connected with the first even clock signal, and an output end of the seventh flip-flop 469 is used for outputting the first even chip select sampling signal. An input end of the eighth flip-flop 471 is connected with the output end of the seventh flip-flop 469, an input end of the second NOT gate 470 is connected with the first even clock signal, an output end of the second NOT gate 470 is connected with a clock end of the eighth flip-flop 471, and an output end of the eighth flip-flop 471 is used for outputting the second even chip select sampling signal.

That is, in the sixth sampling circuit 722, the seventh flip-flop 469, as the first-stage sampling, may perform first-stage sampling on the to-be-processed odd chip select signal by using the rising edge of the first even clock signal, so as to obtain the first even chip select sampling signal. The second NOT gate 470 and the eighth flip-flop 471, as second-stage sampling, may perform inverting on the first even clock signal through the second NOT gate 470, so as to perform second-stage sampling on the first even chip select sampling signal by using the falling edge of the first even clock signal to obtain the second even chip select sampling signal. The first even chip select sampling signal may be represented by PCS_ED, and the second even chip select sampling may be represented by PCS_EDD.

It should also be noted that, in the embodiments of the present disclosure, for the first logic circuit 723, in a specific embodiment, as illustrated in FIG. 8, the first logic circuit 723 may include a first OR gate 472 and a first AND gate 473.

The first OR gate 472 is configured to perform OR operation on the first odd chip select sampling signal and the second odd chip select sampling signal to obtain an intermediate odd signal.

The first AND gate 473 is configured to perform AND operation on the intermediate odd signal and the first odd clock signal to obtain the odd chip select clock signal.

That is, after the first odd chip select sampling signal and the second odd chip select sampling signal are obtained by performing sampling through the fifth sampling circuit 721, the OR operation is firstly performed on the first odd chip select sampling signal and the second odd chip select sampling signal via the first OR gate 472, and the intermediate odd signal may be obtained. Then, the AND operation is performed on the intermediate odd signal and the first odd clock signal via the first AND gate 473, and the CS_CLK_O signal may be obtained.

It should also be noted that, in the embodiments of the present disclosure, for the second logic circuit 724, in a specific embodiment, as illustrated in FIG. 8, the second logic circuit 724 may include a second OR gate 474 and a second AND gate 475.

The second OR gate 474 is configured to perform OR operation on the first even chip select sampling signal and the second even chip select sampling signal to obtain an intermediate even signal.

The second AND gate 475 is configured to perform AND operation on the intermediate even signal and the first even clock signal to obtain the even chip select clock signal.

That is, after the first even chip select sampling signal and the second even chip select sampling signal are obtained by performing sampling through the sixth sampling circuit 722, the OR operation is firstly performed on the first even chip select sampling signal and the second even chip select sampling signal via the second OR gate 474, and the intermediate even signal may be obtained. Then, the AND operation is performed on the intermediate even signal and the first even clock signal via the second AND gate 475, and the CS_CLK_E signal may be obtained.

Specifically, in the embodiments of the present disclosure, both the first OR gate 472 and the second OR gate 474 have the function of increasing the signal pulse width. Taking the first OR gate 472 as an example, the pulse width of the PCS_OD signal is twice the preset clock cycle, the pulse width of the PCS_ODD signal is also twice the preset clock cycle, but the PCS_ODD signal is delayed by one preset clock cycle compared with the PCS_OD signal. In such case, the intermediate odd signal may be obtained by performing the OR operation on the PCS_OD signal and the PCS_ODD signal through the first OR gate 472, and has a pulse width of three times the preset clock cycle; then, the 2T_CLK_O signal having two pulses may be obtained by performing the AND operation on the intermediate odd signal and the PCLK_O signal through the first AND gate 473, and a pulse width of each pulse is the preset clock cycle. Similarly, the pulse width of the intermediate even signal outputted by the second OR gate 474 is three times the preset clock cycle; then, the 2T_CLK_E signal having two pulses may be obtained by performing the AND operation on the intermediate even signal and the PCLK_E signal through the second AND gate 475, and a pulse width of each pulse is the preset clock cycle.

In this way, in the embodiments of the present disclosure, the CS_CLK_O signal and the CS_CLK_E signal may be obtained through the clock processing circuit 72, and then sampling may be performed on the command decoding signal outputted by the chip select control circuit 73 according to the CS_CLK_O signal and the CS_CLK_E signal, so that the target command signal may be obtained.

In some embodiments, based on the signal sampling circuit 70 illustrated in FIG. 7, as illustrated in FIG. 8, the chip select control circuit 73 may include a third logic circuit 731 and a fourth logic circuit 732.

The third logic circuit 731 is configured to perform sampling and inverting on the to-be-processed odd chip select signal by using the first even clock signal to obtain an intermediate even chip select signal, and perform logical operation(s) on the intermediate even chip select signal, the to-be-processed even chip select signal and the to-be-processed even command signal to obtain an even command decoding signal.

The fourth logic circuit 732 is configured to perform sampling and inverting on the to-be-processed even chip select signal by using the first odd clock signal to obtain an intermediate odd chip select signal, and perform logical operation(s) on the intermediate odd chip select signal, the to-be-processed odd chip select signal and the to-be-processed odd command signal to obtain an odd command decoding signal.

The intermediate chip select signal may be composed of the intermediate even chip select signal and the intermediate odd chip select signal, and the command decoding signal may be composed of the even command decoding signal and the odd command decoding signal. The intermediate even chip select signal is represented by PCS_EB, the intermediate odd chip select signal is represented by PCS_OB, the even command decoding signal is represented by CA_1T_ET, and the odd command decoding signal is represented by CA_1T_OT.

In a particular embodiment, based on the signal sampling circuit 70 illustrated in FIG. 7, as illustrated in FIG. 8, the third logic circuit 731 may include a seventh sampling circuit 476, a third AND gate 477 and a fourth AND gate 478.

The seventh sampling circuit 476 is configured to perform sampling and inverting on the to-be-processed odd chip select signal by using the first even clock signal to obtain the intermediate even chip select signal.

The third AND gate 477 is configured to perform AND operation on the intermediate even chip select signal and the to-be-processed even chip select signal to obtain a target even chip select signal.

The fourth AND gate 478 is configured to perform AND operation on the target even chip select signal and the to-be-processed even command signal to obtain the even command decoding signal.

It should be noted that, in the embodiments of the present disclosure, the seventh sampling circuit 476 may include a ninth flip-flop and a third inverter. An input end of the ninth flip-flop is connected with the to-be-processed odd chip select signal, a clock end of the ninth flip-flop is connected with the first even clock signal, an output end of the ninth flip-flop is connected with an input end of the third inverter, and an output end of the third inverter is used for outputting the intermediate even chip select signal.

That is, the input end of the ninth flip-flop is connected with the PCS_O signal, and the clock end of the ninth flip-flop is connected with the PCLK_E signal, that is, sampling and inverting are performed on the PCS_O signal by using the rising edge of the PCLK_E signal to obtain the PCS_EB signal. Then, the AND operation is performed on the PCS_EB signal and the PCS_E signal through the third AND gate 477 to obtain the target even chip select signal represented by PCS_ET. After then, the AND operation is performed on the PCS_ET signal and the CA[4:0]_1T_E signal through the fourth AND gate 478 to obtain the CA_1T_ET signal.

The effect of the aforementioned logic check may be achieved by performing AND logical operation on the PCS_EB signal and the PCS_E signal. As an example, if a CS_n signal (having the even clock cycle at low level) corresponds to the 2T CMD signal, the pulse shape of which is that the previous clock cycle is at high level and the current clock cycle is at low level, then when the PCS_E signal is at a high level, the PCS_EB signal is also at the high level, the PCS_ET signal obtained after the AND logical operation is performed on the two signals is a high level pulse, and the high level pulse may be used for subsequent decoding. If the CS_n signal corresponding to the NT ODT CMD signal is at the low level (the even clock cycle and the next adjacent odd clock cycle are all at the low level), in the first clock cycle when the CS_n signal is at the low level, since the PCS_EB signal is delayed by two preset clock cycles than an inverted signal of the PCS_E signal, then when the PCS_E signal is at the high level, the PCS_EB signal is also at the high level, the PCS_ET signal obtained after the AND logical operation is performed on the two signals is also a high level pulse, and the high level pulse may be used for subsequent decoding. However, if in the second clock cycle when the CS_n signal is at the low level, although the PCS_ET signal obtained after performing AND logical operation on the PCS_E signal and the PCS_EB signal is also a high level pulse, such high level pulse cannot be used for valid decoding for the second clock cycle, thereby avoiding erroneous decoding for the second clock cycle of the NT ODT CMD signal.

It should also be noted that, in the embodiments of the present disclosure, since the CA[4:0]_1T_E signal is not one signal, but represents five signals CA[0]_1T_E~CA[4]_1T_E, then for the fourth AND gate 478, the fourth AND gate 478 is a six-input AND gate, and the six input ends are respectively used for receiving the five signals CA[0]_1T_E~CA[4]_1T_E and the PCS_ET signal. The main function of the fourth AND gate 478 is decoding. In a specific implementation, the fourth AND gate 478 may function as the first half of the first command decoding circuit a in FIG. 3 (including two NAND gates and one NOR gate), and may also achieve the effect of the AND operation. In addition, for decoding circuits for achieving the decoding function, these decoding circuits are specifically designed according to command decoding rules. For different products, different application scenarios and different commands, the decoding rules may be different, so the logic of the decoding circuits may be adjusted accordingly, which are not specifically limited in the embodiments of the present disclosure.

In another specific embodiment, based on the signal sampling circuit 70 illustrated in FIG. 7, as illustrated in FIG. 8, the fourth logic circuit 732 may include an eighth sampling circuit 479, a fifth AND gate 480 and a sixth AND gate 481.

The eighth sampling circuit 479 is configured to perform sampling and inverting on the to-be-processed even chip select signal by using the first odd clock signal to obtain the intermediate odd chip select signal.

The fifth AND gate 480 is configured to perform AND operation on the intermediate odd chip select signal and the to-be-processed odd chip select signal to obtain a target odd chip select signal.

The sixth AND gate 481 is configured to perform AND operation on the target odd chip select signal and the to-be-processed odd command signal to obtain the odd command decoding signal.

It should be noted that, in the embodiments of the present disclosure, the eighth sampling circuit 479 may include a tenth flip-flop and a fourth inverter. An input end of the tenth flip-flop is connected with the to-be-processed even chip select signal, a clock end of the tenth flip-flop is connected with the first odd clock signal, an output end of the tenth flip-flop is connected with an input end of the fourth inverter, and an output end of the fourth inverter is used for outputting the intermediate odd chip select signal.

That is, the input end of the tenth flip-flop is connected with the PCS_E signal, and the clock end of the tenth flip-flop is connected with the PCLK_O signal, that is, sampling and inverting are performed on the PCS_E signal by using the rising edge of the PCLK_O signal to obtain the PCS_OB signal. Then, the AND operation is performed on the PCS_OB signal and the PCS_O signal through the fifth AND gate 480 to obtain the target odd chip select signal represented by PCS_OT. After then, the AND operation is performed on the PCS_OT signal and the CA[4:0]_1T_O signal through the sixth AND gate 481 to obtain the CA_1T_OT signal.

The effect of the aforementioned logic check may also be achieved by performing AND logical operation on the PCS_OB signal and the PCS_O signal. As an example, if a CS_n signal (having the odd clock cycle at low level) corresponds to the 2T CMD signal, the pulse shape of which is that the previous clock cycle is at high level and the current clock cycle is at low level, then when the PCS_O signal is at the high level, the PCS_OB signal is also at the high level, and the PCS_OT signal obtained after performing AND logical operation on the two signals is a high level pulse, and the high level pulse may be used for subsequent decoding.

If the CS_n signal corresponding to the NT ODT CMD signal is at the low level (the odd clock cycle and the next adjacent even clock cycle are all at the low level), in the first clock cycle when the CS_n signal is at the low level, the PCS_O signal is an active-high pulse signal. Since the PCS_OB signal is delayed by two preset clock cycles than an inverted signal of the PCS_O signal, then when the PCS_O signal is at the high level, the PCS_OB signal is also at the high level, the PCS_OT signal obtained after performing AND logical operation on the two signals is also at the high level pulse, and the high level pulse may be used for subsequent decoding. However, if in the second clock cycle when the CS_n signal is at the low level, the PCS_O signal is an active-high pulse signal. Then, when the PCS_O signal is at the high level, the PCS_OB signal is at the low level, and the low level signal is obtained after performing AND logical operation on the two signals, that is, the invalid PCS_OT signal is obtained and cannot be used for subsequent decoding, thereby avoiding erroneous decoding for the second clock cycle of the NT ODT CMD signal.

It should also be noted that, in the embodiments of the present disclosure, since the CA[4:0]_1T_O signal is not one signal, but represents five signals CA[0]_1T_O~CA[4]_1T_O, then for the sixth AND gate 481, the sixth AND gate 481 is a six-input AND gate, and the six input ends are respectively used for receiving the five signals CA[0]_1T_O~CA[4]_1T_O and the PCS_OT signal. The main function of the sixth AND gate 481 is decoding. In a specific implementation, the sixth AND gate 481 may be equivalent to the first half of the second command decoding circuit b in FIG. 3 (including two NAND gates and one NOR gate), and may also achieve the effect of the AND operation. In addition, for decoding circuits for achieving the decoding function, these decoding circuits are specifically designed according to command decoding rules. For different products, different application scenarios and different commands, the decoding rules may be different, so the logic of the decoding circuits may be adjusted accordingly, which are not specifically limited in the embodiments of the present disclosure.

It should also be noted that, in the embodiments of the present disclosure, for the seventh sampling circuit 476 and the eighth sampling circuit 479, since the PCS_O signal or the PCS_E signal is an active-high pulse signal, after the third inverter or the fourth inverter is added, the PCS_EB signal or the PCS_OB signal may become an active-low pulse signal for subsequent logical operations. In addition, for subsequent different logical operations, the seventh sampling circuit 476 and the eighth sampling circuit 479 may not need to set the third inverter and the fourth inverter, and the subsequent logical operations need to be adjusted accordingly, so that the same effect may be achieved.

In this way, through the seventh sampling circuit 476 and the eighth sampling circuit 479 in the chip select control circuit 73, the CS_n signal sampled in the previous clock cycle may be saved, and then AND logical operation is performed on the CS_n signal sampled in the previous clock cycle and the CS_n signal sampled in the current clock cycle to obtain the target odd/even chip select signal, after then AND logical operation is performed on the target odd/even chip select signal and the to-be-processed command signal to obtain the command decoding signal. That is, the CS_n signal sampled in the previous clock cycle is used for logic check, so as to distinguish that the command of the current clock cycle is normal decoding for the first clock cycle of the 2T CMD signal, not erroneous decoding for the second clock cycle of the NT ODT CMD signal, thus solving erroneous decoding for the second clock cycle of the NT ODT CMD signal. Herein, the CS_n signal sampled in the previous clock cycle is embodied in the PCS_EB/PCS_OB signal, the CS_n signal sampled in the current clock cycle is embodied in the PCS_E/PCS_O signal, and the target odd/even chip select signal refers to the PCS_ET/PCS_OT signal.

In some embodiments, based on the signal sampling circuit 70 illustrated in FIG. 7, as illustrated in FIG. 8, the output sampling circuit 74 may include a ninth sampling circuit 741, a tenth sampling circuit 742 and a third OR gate 743.

The ninth sampling circuit 741 is configured to perform sampling on the even command decoding signal by using the odd chip select clock signal to obtain a target odd command signal.

The tenth sampling circuit 742 is configured to perform sampling on the odd command decoding signal by using the even chip select clock signal to obtain a target even command signal.

The third OR gate 743 is configured to perform OR operation on the target odd command signal and the target even command signal to obtain the target command signal.

The target odd command signal may be represented by CMD_O, the target even command signal may be represented by CMD_E, and the target command signal may be represented by CMD.

It should be noted that, in the embodiments of the present disclosure, for the ninth sampling circuit 741, the ninth sampling circuit 741 may include an eleventh flip-flop. An input end of the eleventh flip-flop is connected with the even command decoding signal, a clock end of the eleventh flip-flop is connected with the odd chip select clock signal, and an output end of the eleventh flip-flop is used for outputting the target odd command signal. Specifically, the input end of the eleventh flip-flop is connected with the CA_1T_ET signal, and the clock end of the eleventh flip-flop is connected with the CS_CLK_O signal, that is, the CA_1T_ET signal is sampled by using the rising edge of the CS_CLK_O signal to obtain the CMD_O signal.

It should be noted that, in the embodiments of the present disclosure, for the tenth sampling circuit 742, the tenth sampling circuit 742 may include a twelfth flip-flop. An input end of the twelfth flip-flop is connected with the odd command decoding signal, a clock end of the twelfth flip-flop is connected with the even chip select clock signal, and an output end of the twelfth flip-flop is used for outputting the target even command signal. Specifically, the input end of the twelfth flip-flop is connected with the CA_1T_OT signal, and the clock end of the twelfth flip-flop is connected with the CS_CLK_E signal, that is, the CA_1T_OT signal is sampled by using the rising edge of the CS_CLK_E signal to obtain the CMD_E signal.

In this way, through the signal input circuit 71, the clock processing circuit 72, the chip select control circuit 73 and the output sampling circuit 74, sampling is performed on the to-be-processed chip select signal according to the first clock signal, the CS_n signal sampled in the previous clock cycle may be saved, and then AND logical operation is performed on the CS_n signal sampled in the previous clock cycle and the CS_n signal sampled in the current clock cycle to output the target odd/even chip select signal, after then AND logical operation is performed on the target odd/even chip select signal and the to-be-processed command signal to obtain the command decoding signal. That is, the CS_n signal sampled in the previous clock cycle is used for logic check to achieve the correct decoding of the 2T CMD signal and the NT ODT CMD signal, thus avoiding erroneous decoding for the second clock cycle of the NT ODT CMD signal and enhancing the accuracy of command decoding.

It may also be understood that, in the embodiments of the present disclosure, either the first flip-flop, the second flip-flop, the third flip-flop, the fourth flip-flop, the fifth flip-flop, the sixth flip-flop, the seventh flip-flop or the eighth flip-flop, or even the ninth flip-flop, the tenth flip-flop, the eleventh flip-flop or the twelfth flip-flop may be a DFF.

Figure 9:
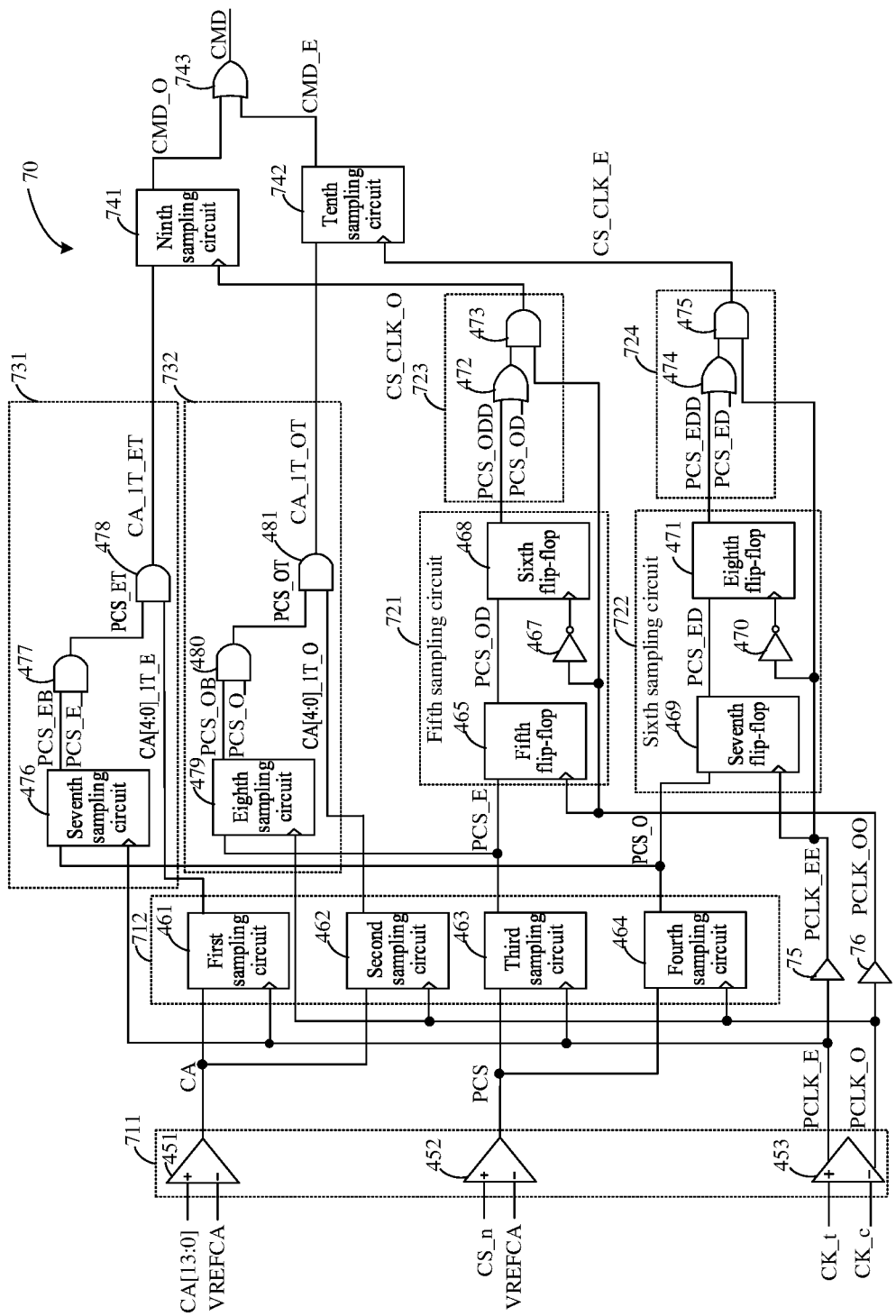
FIG. 9 is a third schematic diagram of a composition structure of a signal sampling circuit according to an embodiment of the present disclosure.

In addition, in some embodiments, firstly, delay processing may be performed on the first even clock signal and the first odd clock signal inputted to the clock processing circuit 72. In this way, in some embodiments, based on the signal sampling circuit 70 illustrated in FIG. 8, as illustrated in FIG. 9, the signal sampling circuit 70 may further include a first buffer 75 and a second buffer 76.

The first buffer 75 is configured to perform delay processing on the first even clock signal to obtain a first even clock delay signal.

The second buffer 76 is configured to perform delay processing on the first odd clock signal to obtain a first odd clock delay signal.

It should be noted that, in the embodiments of the present disclosure, it is necessary to perform delay processing on the first even clock signal and the first odd clock signal before being inputted to the clock processing circuit 72. The first even clock delay signal is represented by PCLK_EE, and the first odd clock delay signal is represented by PCLK_OO.

It should also be noted that, for the buffers, either the first buffer 75 or the second buffer 76 not only has a delay function, but also has a function of enhancing the signal driving capability. Specifically, for the first even clock delay signal and the first even clock signal, compared with the first even clock signal, the first even clock delay signal not only has a delay, but also has a stronger driving capability. For the first odd clock delay signal and the first odd clock signal, compared with the first odd clock signal, the first odd clock delay signal not only has a delay, but also has a stronger driving capability.

In the embodiments of the present disclosure, each of the first buffer 75 and the second buffer 76 may include one or more buffers. Here, the specific number of the buffers may be set according to the actual demands, which is not specifically limited in the embodiments of the present disclosure.

In this way, in the embodiments of the present disclosure, after the first even clock signal and the first odd clock signal are subjected to the delay processing, the PCLK_EE signal and the PCLK_OO signal obtained after the delay processing are inputted to the clock processing circuit 72, and then the CS_CLK_O signal and the CS_CLK_E signal may be obtained through the clock processing circuit 72. Subsequently, the command decoding signals outputted by the chip select control circuit 73 are sampled according to the CS_CLK_O signal and the CS_CLK_E signal, so that the target command signal may be obtained through the output sampling circuit 74. In such case, the target command signal avoids erroneous decoding for the second clock cycle of the NT ODT CMD signal and enhances the accuracy of command decoding.

In addition, in some embodiments, the initial chip select signal may be a signal indicating that a target chip is selected, and the initial chip select signal is an active-low pulse signal.

When the initial chip select signal includes one pulse and has a pulse width of the preset clock cycle, the target command signal obtained by the signal sampling circuit 70 is a valid decoding signal. The target command signal is a Command signal in a DDR5 DRAM chip, and the Command signal includes a read command signal, a write command signal, a refresh command signal, a pre-charge command signal and an active command signal.

When the initial chip select signal includes one pulse and has a pulse width of twice the preset clock cycle, the target command signal obtained by the signal sampling circuit 70 is the valid decoding signal, and the target command signal is a Non-Target ODT Command signal in the DDR5 DRAM chip.

It should be noted that, in the embodiments of the present disclosure, by adding one-stage chip select control circuit 73 of the CS_n, the CS_n signal sampled in the previous clock cycle is saved, and then the AND logical operation is performed on the CS_n signal sampled in the previous clock cycle and the CS_n signal sampled in the current clock cycle, so that the target odd/even chip select signal may be obtained, that is, the PCS_ET/PCS_OT signal illustrated in FIG. 7 to FIG. 9. The CS_n signal sampled in the previous clock cycle is embodied in the PCS_EB/PCS_OB signal, and the CS_n signal sampled in the current clock cycle is embodied in the PCS_E/PCS_O signal.

It should also be noted that, in the embodiments of the present disclosure, in combination with the two chip select signals with different pulse widths in FIG. 5, on the one hand, if the CS_n signal in the previous clock cycle is at the high level and the CS_n signal in the current clock cycle is at the low level, this may be identified as a normal command to perform decoding. On the other hand, if the CS_n signal in the previous clock cycle is at the low level and the CS_n signal in the current clock cycle is still at the low level, this may be identified as the second clock cycle of the NT ODT CMD signal, and no additional command decoding is performed, thus eliminating erroneous decoding for the second clock cycle of the NT ODT CMD signal. On the yet another hand, no matter what the level of the CS_n signal in the previous clock cycle is, as long as the CS_n signal in the current clock cycle is at the high level, no command decoding is performed in such case, thus ensuring that the logic will not affect the normal command decoding.

In one possible implementation, in a case where a pulse width of the initial chip select signal is twice the preset clock cycle, when the first chip select signal is sampled to be at a low level in a rising edge of an even clock cycle and sampled still to be at the low level in a rising edge of a next adjacent odd clock cycle, it is determined that both the even chip select clock signal and the odd chip select clock signal are valid pulse signals, and a first pulse of the even chip select clock signal is delayed by one preset clock cycle than a first pulse of the odd chip select clock signal; and it is determined that the target even chip select signal is an active-high pulse signal, so that the target command signal is obtained by performing sampling on the even command decoding signal based on the odd chip select clock signal.

The target command signal includes one pulse and a pulse width of the pulse is twice the preset clock cycle. A rising edge of the first pulse of the odd chip select clock signal is used to generate a rising edge of the target command signal, and a rising edge of the second pulse of the odd chip select clock signal is used to generate a falling edge of the target command signal.

In another possible implementation, in a case where a pulse width of the initial chip select signal is twice the preset clock cycle, when the first chip select signal is sampled to be at a low level in a rising edge of an odd clock cycle and sampled still to be at the low level in a rising edge of a next adjacent even clock cycle, it is determined that both the even chip select clock signal and the odd chip select clock signal are valid pulse signals, and a first pulse of the odd chip select clock signal is delayed by one preset clock cycle than a first pulse of the even chip select clock signal; and it is determined that the target odd chip select signal is an active-high pulse signal, so that the target command signal is obtained by performing sampling on the odd command decoding signal based on the even chip select clock signal.

The target command signal includes one pulse and a pulse width of the pulse is twice the preset clock cycle. A rising edge of the first pulse of the even chip select clock signal is used to generate a rising edge of the target command signal, and a rising edge of the second pulse of the even chip select clock signal is used to generate a falling edge of the target command signal.

It should be noted that, in the embodiments of the present disclosure, the even clock cycle or the odd clock cycles refers to the clock cycle of the initial clock signal (represented by CK_t/CK_c). Specifically, PCLK_E signal and PCLK_O signal may be obtained after frequency division is preformed via the third receiving circuit 453; then, the clock cycle where the rising edge of the PCLK_E signal is located is taken as the even clock cycle, and the clock cycle where the rising edge of the PCLK_O signal is located is taken as the odd clock cycle.

It should also be noted that, in the embodiments of the present disclosure, when the first chip select signal is sampled to be at the low level in a rising edge of the even clock cycle and sampled still to be at the low level in a rising edge of the next adjacent odd clock cycle, both the even chip select clock signal and the odd chip select clock signal are active-high pulse signals, and each signal includes two pulses, each of which has the pulse width of the preset clock cycle. In addition, the first pulse of the even chip select clock signal is delayed by one preset clock cycle than the first pulse of the odd chip select clock signal. In addition, the target odd chip select signal is a low level signal, and the target even chip select signal is an active-high pulse signal and includes only one pulse having the pulse width of twice the preset clock cycle, so that the target command signal is obtained by performing sampling on the even command decoding signal based on the odd chip select clock signal. Here, the target command signal includes only one pulse and the pulse width of the pulse is twice the preset clock cycle. The rising edge of the first pulse of the odd chip select clock signal is used to generate the rising edge of the target command signal, and the rising edge of the second pulse of the odd chip select clock signal is used to generate the falling edge of the target command signal.

In addition, it should be noted that, both "the pulse width being one preset clock cycle" and "the pulse width being twice the preset clock cycle" herein refer to being within the preset precision range. Specifically, the offset between the pulse width and one preset clock cycle is within the preset precision range, or the offset between the pulse width and twice the preset clock cycle is within the preset precision range. Exemplarily, the pulse width of the target command signal is twice the preset clock cycle within the preset precision range.

It should also be noted that, in the embodiments of the present disclosure, when the first chip select signal is sampled to be at the low level in a rising edge of the odd clock cycle and sampled still to be at the low level in a rising edge of the next adjacent even clock cycle, both the even chip select clock signal and the odd chip select clock signal are active-high pulse signals, and each signal includes two pulses, each of which has the pulse width of the preset clock cycle. In addition, the first pulse of the odd chip select clock signal is delayed by one preset clock cycle than the first pulse of the even chip select clock signal. In addition, the target even chip select signal is a low level signal, and the target odd chip select signal is an active-high pulse signal and includes only one pulse having the pulse width of twice the preset clock cycle, so that the target command signal is obtained by performing sampling on the odd command decoding signal based on the even chip select clock signal. Here, the target command signal also includes only one pulse and the pulse width of the pulse is twice the preset clock cycle within the preset precision range. The rising edge of the first pulse of the even chip select clock signal is used to generate the rising edge of the target command signal, and the rising edge of the second pulse of the even chip select clock signal is used to generate the falling edge of the target command signal.

The embodiments of the present disclosure provide a signal sampling circuit. Based on the signal sampling circuit, for the decoding of the two commands 2T CMD and NT ODT CMD, the correct decoding of the 2T CMD signal and the NT ODT CMD signal may be achieved through the chip select control circuit, thereby avoiding erroneous decoding for the second clock cycle of the NT ODT CMD signal and enhancing the accuracy of commands decoding.

Figure 10:
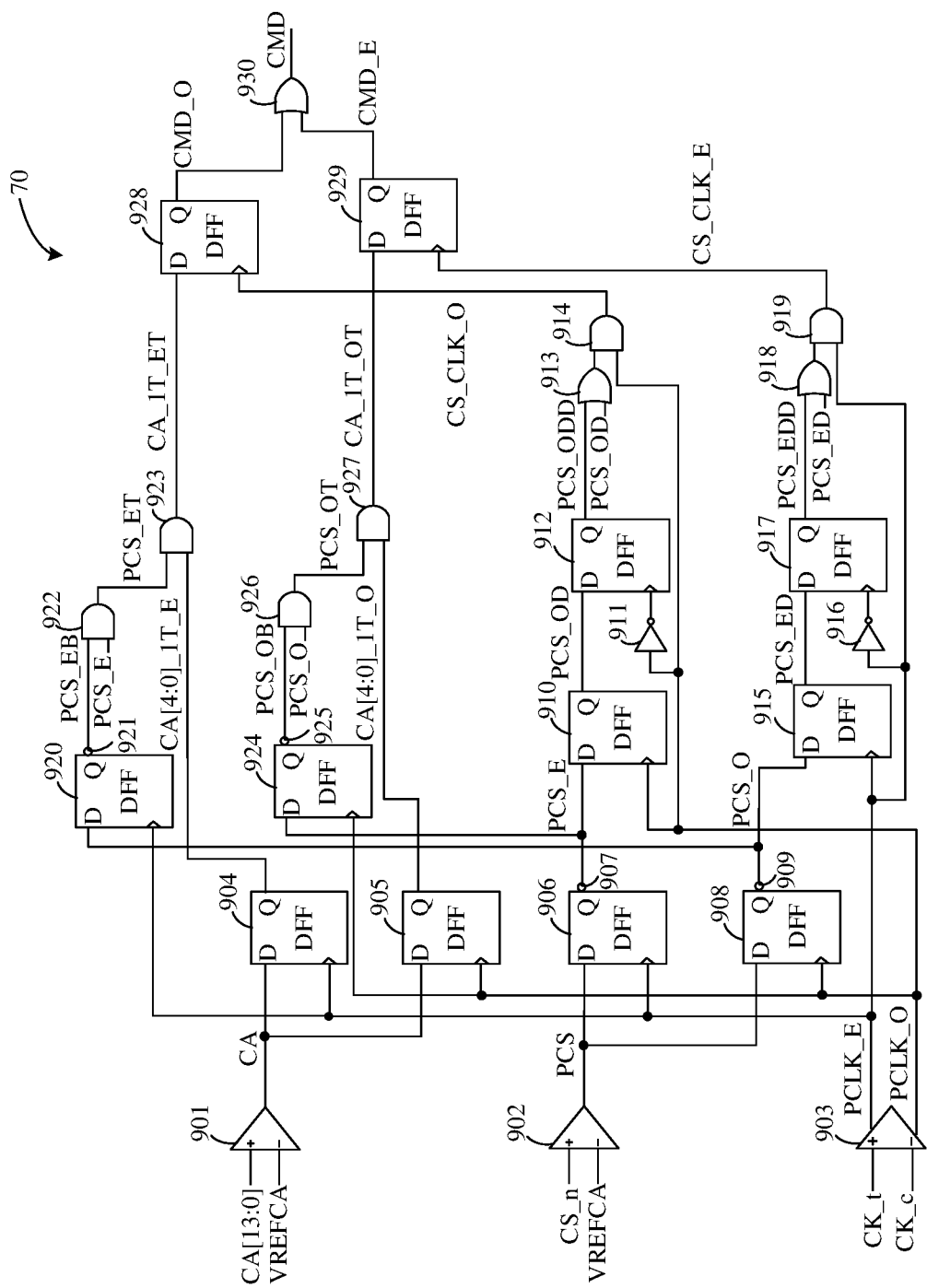
FIG. 10 is a schematic diagram of a detailed structure of a signal sampling circuit according to an embodiment of the present disclosure.

In another embodiment of the present disclosure, based on the signal sampling circuit 70 described in the above embodiments, referring to FIG. 10, a schematic diagram of a detailed structure of a signal sampling circuit according to an embodiment of the present disclosure is illustrated. As illustrated in FIG. 10, the signal sampling circuit 70 may include a first receiver 901, a second receiver 902, a third receiver 903, a first flip-flop 904, a second flip-flop 905, a third flip-flop 906, a first inverter 907, a fourth flip-flop 908, a second inverter 909, a fifth flip-flop 910, a first NOT gate 911, a sixth flip-flop 912, a first OR gate 913, a first AND gate 914, a seventh flip-flop 915, a second NOT gate 916, an eighth flip-flop 917, a second OR gate 918, a second AND gate 919, a ninth flip-flop 920, a third inverter 921, a third AND gate 922, a fourth AND gate 923, a tenth flip-flop 924, a fourth inverter 925, a fifth AND gate 926, a sixth AND gate 927, an eleventh flip-flop 928, a twelfth flip-flop 929 and a third OR gate 930. The first flip-flop 904, the second flip-flop 905, the third flip-flop 906, the fourth flip-flop 908, the fifth flip-flop 910, the sixth flip-flop 912, the seventh flip-flop 915, the eighth flip-flop 917, the ninth flip-flop 920, the tenth flip-flop 924, the eleventh flip-flop 928 and the twelfth flip-flop 929 each may be composed of a DFF.

It should be noted that, the composition structure of FIG. 10 is similar to that of FIG. 8, and the description on FIG. 10 may be referred to the foregoing description on FIG. 8, and will not be elaborated herein.

In the embodiments of the present disclosure, since the CA[4:0]_1T_E signal represents five signals CA[0]_1T_E~CA[4]_1T_E, for the fourth AND gate 923, the fourth AND gate 923 is a six-input AND gate, and the six input ends are used for receiving the five signals CA[0]_1T_E~CA[4]_1T_E and the PCS_ET signal, respectively. Since the CA_1T_ET signal outputted by the fourth AND gate 923 represents one signal, only one eleventh flip-flop 928 is required. Similarly, since the CA[4:0]_1T_O signal represents five signals CA[0]_1T_O~CA[4]_1T_O, for the sixth AND gate 927, the sixth AND gate 927 is a six-input AND gate, and the six input ends are used for receiving the five signals CA[0]_1T_O~CA[4]_1T_O and the PCS_OT signal, respectively. Since the CA_1T_OT signal outputted by the sixth AND gate 927 represents one signal, only one twelfth flip-flop 929 is required.

Figure 11A:
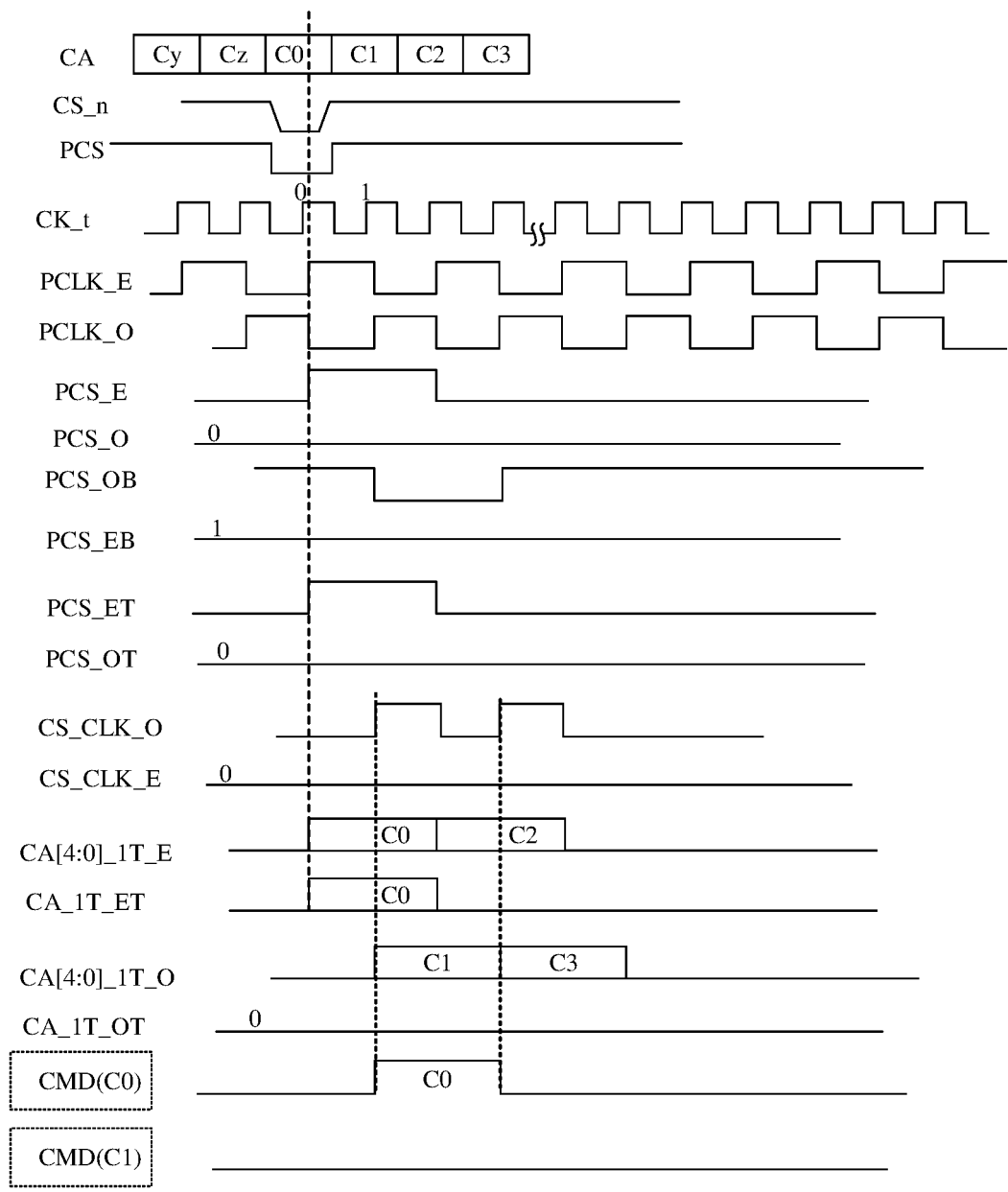
FIG. 11A is a first schematic diagram of signal timing of a signal sampling circuit according to an embodiment of the present disclosure.
Figure 11B:
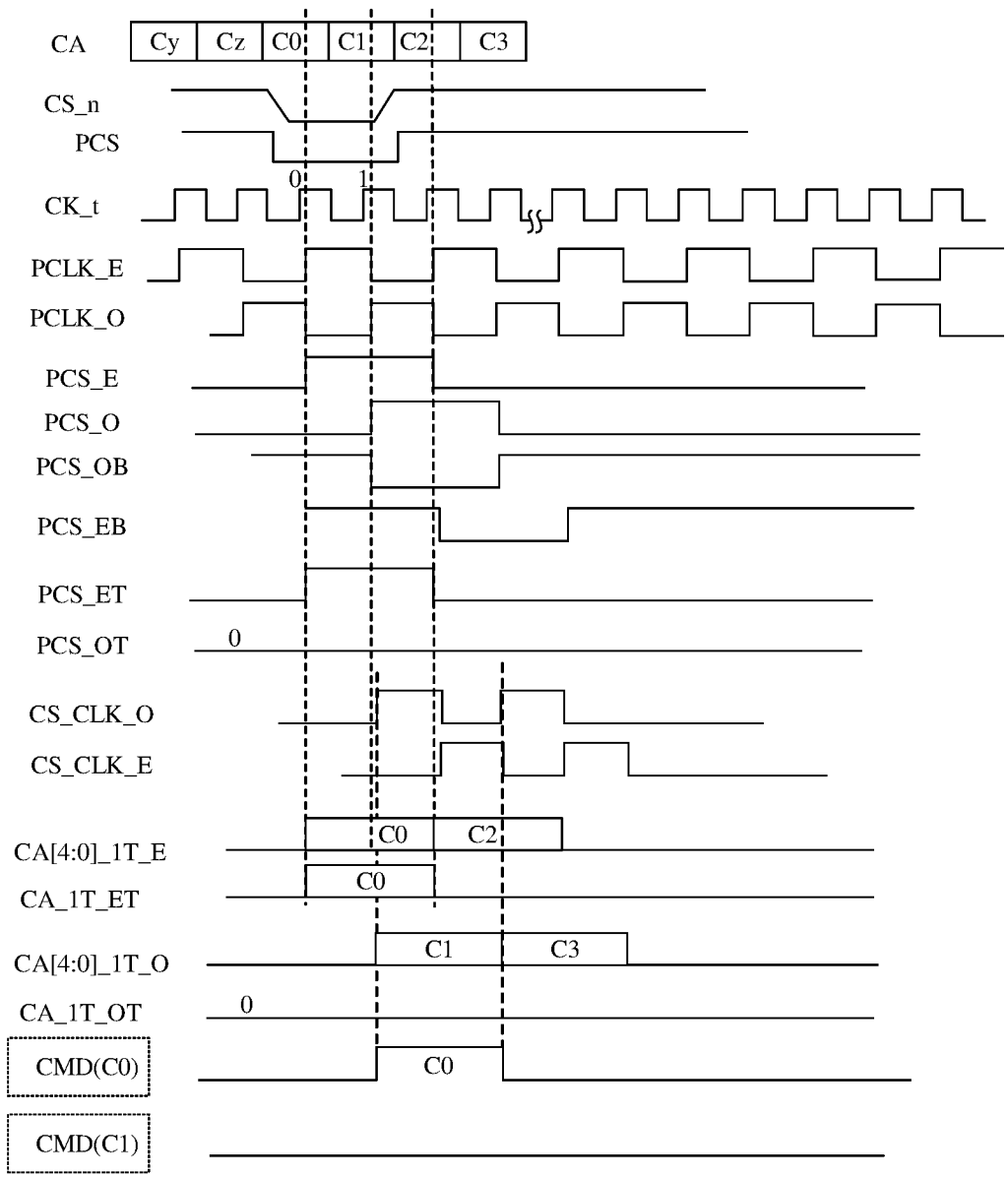
FIG. 11B is a second schematic diagram of signal timing of a signal sampling circuit according to an embodiment of the present disclosure.

Based on the signal sampling circuit 70 illustrated in FIG. 10, the corresponding signal timings are illustrated in FIG. 11A and FIG. 11B. In FIG. 11A and FIG. 11B, the first command address signal is represented by CA, and the CA may include Cy, Cz, C0, C1, C2, and C3 information; the initial chip select signal is represented by CS_n, the first chip select signal is represented by PCS, the CS_n signal is an active-low pulse signal, and CS_n is a signal indicating that a target chip is selected; the initial clock signal is represented by CK_t, the first even clock signal is represented by PCLK_E, the first odd clock signal is represented by PCLK_O, the clock cycle of the CK_t signal is the preset clock cycle, and the clock cycle of each of the PCLK_E signal and the PCLK_O signal is twice the preset clock cycle and a phase difference between the PCLK_E signal and the PCLK_O signal is 180 degrees.

When the pulse width of the CS_n signal is the preset clock cycle, the CS_n signal corresponds to the 2T CMD signal. Specifically, as illustrated in FIG. 11A, if the PCS signal is sampled in the rising edge of the even clock cycle to be at the low level, after the CA signal is sampled by using the rising edge of the PCLK_E signal, the obtained CA[4:0]_1T_E signal includes C0 and C2 information; and after the CA signal is sampled by using the rising edge of the PCLK_O signal, the obtained CA[4:0]_1T_O signal includes C1 and C3 information. After sampling and inverting are performed on the PCS signal by using the rising edge of the PCLK_E signal, the obtained PCS_E signal is an active-high pulse signal and has a pulse width of twice the preset clock cycle; and after sampling and inverting are performed on the PCS signal by using the rising edge of the PCLK_O signal, the obtained PCS_O signal is a low level signal. Then, after rising edge sampling and inverting are performed on the PCS_E signal through the tenth flip-flop 924 and the fourth inverter 925, the obtained PCS_OB signal is an active-low pulse signal and has a pulse width of twice the preset clock cycle; and after rising edge sampling and inverting are performed on the PCS_O signal through the ninth flip-flop 920 and the third inverter 921, the obtained PCS_EB signal is a high level signal. Since the PCS_O signal is a low level signal, the PCS_OT signal obtained by performing AND logical operation on the PCS_O signal and the PCS_OB signal is a low level signal, and then AND logical operation is performed on the PCS_OT signal and the CA[4:0]_1T_O signal to obtain the CA_1T_OT signal. Since the PCS_OT signal has no valid pulse, there is no command decoding. The PCS_ET signal obtained by performing AND logical operation on the PCS_E signal and the PCS_EB signal is an active-high pulse signal and has a pulse width of twice the preset clock cycle; and then AND logical operation is performed on the PCS_ET signal and CA[4:0]_1T_E signal to obtain CA_1T_ET signal. Since the PCS_ET has a valid pulse, in such case, the command decoding includes C0 information. In addition, two-stage sampling is performed on the PCS_E signal through the fifth flip-flop 910, the first NOT gate 911 and the sixth flip-flop 912, then OR operation is performed on the PCS_ODD signal and the PCS_OD signal obtained by the two-stage sampling through the first OR gate 913, and the output intermediate odd signal is an active-high pulse signal and has a pulse width of three times the preset clock cycle, that is, the function of the first OR gate 913 is to increase the pulse width of the signal. Then, AND operation is performed on the intermediate odd signal and the PCLK_O signal through the first AND gate 914 to obtain the CS_CLK_O signal. The obtained CS_CLK_O signal includes two pulses, and a pulse width of each pulse is the preset clock cycle. Since the PCS_O signal is a low level signal, two-stage sampling is performed on the PCS_O signal through the seventh flip-flop 915, the second NOT gate 916 and the eighth flip-flop 917, and then the logical operations are performed through the second OR gate 918 and the second AND gate 919, the obtained CS_CLK_E signal is also a low level signal. In this way, rising edge sampling is performed on the CA_1T_ET signal by using the CS_CLK_O signal, and the obtained CMD signal only includes C0 information. The rising edge of the first pulse of the CS_CLK_O signal is used to generate the rising edge of the CMD signal, and the rising edge of the second pulse of the CS_CLK_O signal is used to generate the falling edge of the CMD signal.

When the pulse width of the CS_n signal is twice the preset clock cycle, the CS_n signal corresponds to the NT ODT CMD signal. Specifically, as illustrated in FIG. 11B, if the PCS signal is sampled to be at the low level in the rising edge of the even clock cycle and sampled still to be at the low level in the rising edge of the next adjacent odd clock cycle, after the CA signal is sampled by using the rising edge of the PCLK_E signal, the obtained CA[4:0]_1T_E signal includes C0 and C2 information; and after the CA signal is sampled by using the rising edge of the PCLK_O signal, the obtained CA[4:0]_1T_O signal includes C1 and C3 information. After sampling and inverting are performed on the PCS signal by using the rising edge of the PCLK_E signal, the obtained PCS_E signal is an active-high pulse signal and has a pulse width of twice the preset clock cycle; and after sampling and inverting are performed on the PCS signal by using the rising edge of the PCLK_O signal, the obtained PCS_O signal is an active-high pulse signal and has a pulse width of twice the preset clock cycle, but the PCS_O signal is delayed by one preset clock cycle compared with the PCS_E signal. Then, after rising edge sampling and inverting are performed on the PCS_E signal through the tenth flip-flop 924 and the fourth inverter 925, the obtained PCS_OB signal is an active-low pulse signal and has a pulse width of twice the preset clock cycle; and after rising edge sampling and inverting are performed on the PCS_O signal through the ninth flip-flop 920 and the third inverter 921, the obtained PCS_EB signal is an active-low pulse signal and has a pulse width of twice the preset clock cycle, but the PCS_EB signal is delayed by one preset clock cycle compared with the PCS_OB signal. Since the PCS_O signal and the PCS_OB signal are inverted signals to each other, the PCS_OT signal obtained by performing AND logical operation on the PCS_O signal and the PCS_OB signal is a low level signal, and then AND logical operation is performed on the PCS_OT signal and CA[4:0]_1T_O signal to obtain the CA_1T_OT signal. Since the PCS_OT signal has no valid pulse, there is no command decoding. The PCS_ET signal obtained by performing AND logical operation on the PCS_E signal and the PCS_EB signal is an active-high pulse signal and has a pulse width of twice the preset clock cycle; and then AND logical operation is performed on the PCS_ET signal and CA[4:0]_1T_E signal to obtain the CA_1T_ET signal. Since the PCS_ET signal has a valid pulse, in such case, the command decoding includes C0 information. In addition, two-stage sampling is performed on the PCS_E signal through the fifth flip-flop 910, the first NOT gate 911 and the sixth flip-flop 912, then OR operation is performed on the PCS_ODD signal and the PCS_OD signal obtained by the two-stage sampling through the first OR gate 913, and the output intermediate odd signal is an active-high pulse signal and has a pulse width of three times the preset clock cycle, that is, the function of the first OR gate 913 is to increase the pulse width of the signal. Then, AND operation is performed on the intermediate odd signal and the PCLK_O signal through the first AND gate 914, and the obtained CS_CLK_O signal includes two pulses, and a pulse width of each pulse is the preset clock cycle. Two-stage sampling is performed on the PCS_O signal through the seventh flip-flop 915, the second NOT gate 916 and the eighth flip-flop 917, then OR operation is performed on the PCS_EDD signal and the PCS_ED signal obtained by the two-stage sampling through the second OR gate 918, and the output intermediate even signal is an active-high pulse signal and has a pulse width of three times the preset clock cycle, that is, the function of the second OR gate 918 is also to increase the pulse width of the signal. Then, AND operation is performed on the intermediate even signal and the PCLK_E signal through the second AND gate 919, the obtained CS_CLK_E signal also includes two pulses, and a pulse width of each of the pulses is the preset clock cycle, but the CS_CLK_E signal is delayed by one preset clock cycle compared with the first pulse of the CS_CLK_O signal. In this way, rising edge sampling is performed on the CA_1T_ET signal by using the CS_CLK_O signal, and the obtained CMD signal only includes C0 information. The rising edge of the first pulse of the CS_CLK_O signal is used to generate the rising edge of the CMD signal, and the rising edge of the second pulse of the CS_CLK_O signal is used to generate the falling edge of the CMD signal.

In the embodiments of the present disclosure, the even clock cycle refers to the clock cycle where the rising edge of PCLK_E is located, and the odd clock cycle refers to the clock cycle where the rising edge of PCLK_O is located.

In addition, in the embodiments of the present disclosure, when the pulse width of the CS_n signal is the preset clock cycle, the timing waveform provided in FIG. 11A is the timing case in which the PCS signal is sampled in a rising edge of the even clock cycle to be at the low level. This is similar to the timing case in which the PCS signal is sampled in a rising edge of the odd clock cycle to be at the low level and will not be elaborated herein. In addition, when the pulse width of the CS_n signal is twice the preset clock cycle, the timing waveform provided in FIG. 11B is the timing case in which the PCS signal is sampled to be at the low level in a rising edge of the even clock cycle and sampled still to be at the low level in a rising edge of the next adjacent odd clock cycle. This is similar to the timing case in which the PCS signal is sampled to be at the low level in a rising edge of the odd clock cycle and sampled still to be at the low level in a rising edge of the next adjacent even clock cycle and will not be elaborated herein.

That is, based on the signal sampling circuit 70 according to the embodiments of the present disclosure, no command of C1 is output from the CMD in the second clock cycle of the NT ODT CMD signal. Therefore, erroneous decoding for the second clock cycle of the NT ODT CMD signal may be solved. Specifically, as illustrated in FIG. 11B, the CS_n signal is at a low level only for two preset clock cycles, which corresponds to the NT ODT CMD signal, and the CS_n signal is sampled respectively by the PCLK_E signal and the PCLK_O signal into the PCS_E signal (first clock cycle) and the PCS_O signal (second clock cycle). Then, the PCS_E signal is sampled by the PCLK_O signal to generate the PCS_OB signal, and the PCS_O signal is sampled by the PCLK_E signal to generate the PCS_EB signal. In the first clock cycle when the CS_n signal is at the low level, AND logical operation is performed on the PCS_E signal and the PCS_EB signal to generate the PCS_ET signal, which is normally decoded into the NT ODT CMD signal. In the second clock cycle when the CS_n signal is at the low level, AND logical operation is performed on the PCS_O signal and the PCS_OB signal to generate the PCS_OT signal. In this technical solution, the CS_n signals of the previous clock cycle and the current clock cycle are identified as the low level through such logic, so that the PCS_OT signal has no valid pulse, thus the obtained CA_1T_OT signal is an invalid command decoding signal, and no CMD may be generated after sampling is performed by using the CS_CLK_E signal. Therefore, erroneous decoding for the second clock cycle of the NT ODT CMD signal may be solved while ensuring the normal decoding of the first clock cycle.

The embodiments of the present disclosure provide a signal sampling circuit, and the specific implementation of the above embodiments are described in detail through the present embodiment, from which it can be seen that, based on the technical solution of the embodiments of the present disclosure, for the decoding of the two commands 2T CMD and NT ODT CMD, the correct decoding of the 2T CMD signal and the NT ODT CMD signal may be ensured through the chip select control circuit, thereby avoiding erroneous decoding for the second clock cycle of the NT ODT CMD signal and enhancing the accuracy of commands decoding.

Figure 12:
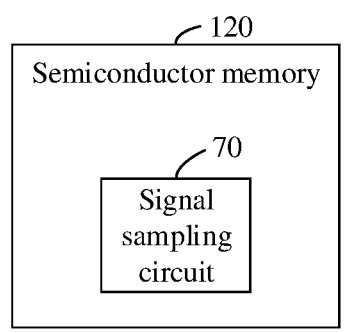
FIG. 12 is a schematic diagram of a composition structure of a semiconductor memory according to an embodiment of the present disclosure.

In another embodiment of the present disclosure, referring to FIG. 12, a schematic diagram of a composition structure of a semiconductor memory 120 according to an embodiment of the present disclosure is illustrated. As illustrated in FIG. 12, the semiconductor memory 120 may include the signal sampling circuit 70 as described in any one of the preceding embodiments.

In the embodiments of the present disclosure, the semiconductor memory 120 may be a DRAM chip.

Further, in some embodiments, the DRAM chip conforms to a DDR5 memory specification.

It should be noted that, the embodiments of the present disclosure mainly relate to related circuits of input signal sampling and command decoding in integrated circuit design, in particular to, in the DRAM chip, control adjustment circuits for performing sampling and decoding on CA signals (as command and address signals). Specifically, the technical solution of the embodiments of the present disclosure solves the problem that the command of the normal CMD DEC is wrongly decoded caused by the special situation of the CS_n in the decoding process of the NT ODT CMD signal of the DDR5. The technical solution utilizes the logic check of the CS_n sampled in the previous clock cycle to ensure that the command of the current clock cycle is in the first clock cycle of the normal 2T CMD signal for normal decoding, not in the second clock cycle of the wrongly decoded NT ODT CMD signal.

In addition, it should also be noted that, the technical solution of the embodiments of the present disclosure may be applied, but is not limited, to control circuits of the CA signal sampling and decoding in the DRAM chip. Other related circuits of input signal sampling and command decoding may adopt the design.

In the embodiments of the present disclosure, the semiconductor memory 120 includes the signal sampling circuit 70. Thus, sampling is performed on the to-be-processed chip select signal according to the first clock signal, the CS_n signal sampled in the previous clock cycle may be saved, and AND logical output of the CS_n signal sampled in the previous clock cycle and the CS_n signal sampled in the current clock cycle may be used as the input of command decoding, that is, the CS_n signal sampled in the previous clock cycle is used for logic check, thereby avoiding erroneous decoding for the second clock cycle of the NT ODT CMD signal and enhancing the accuracy of command decoding.

The above are merely the preferred embodiments of the present disclosure and are not intended to limit the scope of the present disclosure.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

In the embodiments of the present disclosure, the signal sampling circuit includes a signal input circuit, a clock processing circuit, a chip select control circuit and an output sampling circuit. The signal input circuit is configured to determine a to-be-processed command signal and a to-be-processed chip select signal according to a first clock signal, a first chip select signal and a first command address signal, and a clock cycle of the first clock signal is twice a preset clock cycle. The clock processing circuit is configured to perform two-stage sampling and logical operation on the to-be-processed chip select signal according to the first clock signal to obtain a chip select clock signal, and the chip select clock signal includes two pulses and a pulse width of each of the pulses is the preset clock cycle. The chip select control circuit is configured to perform sampling on the to-be-processed chip select signal according to the first clock signal to obtain an intermediate chip select signal, and perform logical operation on the intermediate chip select signal, the to-be-processed chip select signal and the to-be-processed command signal to obtain a command decoding signal. The output sampling circuit is configured to perform sampling on the command decoding signal according to the chip select clock signal to obtain a target command signal. Thus, based on the signal sampling circuit, for the decoding of the two commands 2T CMD and NT ODT CMD, the correct decoding of the 2T CMD signal and the NT ODT CMD signal may be ensured through the chip select control circuit, thereby avoiding erroneous decoding for the second clock cycle of the NT ODT CMD signal and enhancing the accuracy of commands decoding.

The invention claimed is:

1. A signal sampling circuit, comprising:
a signal input circuit, configured to determine a to-be-processed command signal and a to-be-processed chip select signal according to a first clock signal, a first chip select signal and a first command address signal, a clock cycle of the first clock signal being twice a preset clock cycle;
a clock processing circuit, configured to perform two-stage sampling and logical operation on the to-be-processed chip select signal according to the first clock signal to obtain a chip select clock signal, the chip select clock signal comprising two pulses and a pulse width of each of the two pulses being the preset clock cycle;
a chip select control circuit, configured to perform sampling on the to-be-processed chip select signal according to the first clock signal to obtain an intermediate chip select signal, and perform logical operations on the intermediate chip select signal, the to-be-processed chip select signal and the to-be-processed command signal to obtain a command decoding signal; and
an output sampling circuit, configured to perform sampling on the command decoding signal according to the chip select clock signal to obtain a target command signal.

2. The signal sampling circuit of claim 1, wherein the signal input circuit comprises:
a first receiving circuit, configured to receive an initial command address signal and output the first command address signal;
a second receiving circuit, configured to receive an initial chip select signal and output the first chip select signal;
a third receiving circuit, configured to receive an initial clock signal and perform frequency division on the initial clock signal to output a first odd clock signal and a first even clock signal; and
an input sampling circuit, configured to perform sampling on the first chip select signal and the first command address signal according to the first clock signal, to obtain the to-be-processed command signal and the to-be-processed chip select signal;
wherein a clock cycle of the initial clock signal is the preset clock cycle, the first clock signal comprises the first odd clock signal and the first even clock signal, a clock cycle of each of the first odd clock signal and the first even clock signal is twice the preset clock cycle, and a phase difference between the first odd clock signal and the first even clock signal is 180 degrees.

3. The signal sampling circuit of claim 2, wherein the input sampling circuit comprises:

a first sampling circuit, configured to perform sampling on the first command address signal according to the first even clock signal to obtain a to-be-processed even command signal;
a second sampling circuit, configured to perform sampling on the first command address signal according to the first odd clock signal to obtain a to-be-processed odd command signal;
a third sampling circuit, configured to perform sampling and inverting on the first chip select signal according to the first even clock signal to obtain a to-be-processed even chip select signal; and
a fourth sampling circuit, configured to perform sampling and inverting on the first chip select signal according to the first odd clock signal to obtain a to-be-processed odd chip select signal;
wherein the to-be-processed command signal comprises the to-be-processed even command signal and the to-be-processed odd command signal, and the to-be-processed chip select signal comprises the to-be-processed even chip select signal and the to-be-processed odd chip select signal.

4. The signal sampling circuit of claim 3, wherein
the first sampling circuit comprises a first flip-flop, an input end of the first flip-flop is connected with the first command address signal, a clock end of the first flip-flop is connected with the first even clock signal, and an output end of the first flip-flop is used for outputting the to-be-processed even command signal;
the second sampling circuit comprises a second flip-flop, an input end of the second flip-flop is connected with the first command address signal, a clock end of the second flip-flop is connected with the first odd clock signal, and an output end of the second flip-flop is used for outputting the to-be-processed odd command signal;
the third sampling circuit comprises a third flip-flop and a first inverter, an input end of the third flip-flop is connected with the first chip select signal, a clock end of the third flip-flop is connected with the first even clock signal, an output end of the third flip-flop is connected with an input end of the first inverter, and an output end of the first inverter is used for outputting the to-be-processed even chip select signal; and
the fourth sampling circuit comprises a fourth flip-flop and a second inverter, an input end of the fourth flip-flop is connected with the first chip select signal, a clock end of the fourth flip-flop is connected with the first odd clock signal, an output end of the fourth flip-flop is connected with an input end of the second inverter, and an output end of the second inverter is used for outputting the to-be-processed odd chip select signal.

5. The signal sampling circuit of claim 3, wherein the clock processing circuit comprises:
a fifth sampling circuit, configured to perform first-stage sampling on the to-be-processed even chip select signal by using the first odd clock signal to obtain a first odd chip select sampling signal, and perform second-stage sampling on the first odd chip select sampling signal by using the first odd clock signal to obtain a second odd chip select sampling signal;
a sixth sampling circuit, configured to perform first-stage sampling on the to-be-processed odd chip select signal by using the first even clock signal to obtain a first even chip select sampling signal, and perform second-stage sampling on the first even chip select sampling signal by using the first even clock signal to obtain a second even chip select sampling signal;
a first logic circuit, configured to perform logical operation on the first odd clock signal, the first odd chip select sampling signal and the second odd chip select sampling signal to obtain an odd chip select clock signal; and
a second logic circuit, configured to perform logical operation on the first even clock signal, the first even chip select sampling signal and the second even chip select sampling signal to obtain an even chip select clock signal;
wherein the chip select clock signal comprises the even chip select clock signal and the odd chip select clock signal.

6. The signal sampling circuit of claim 5, wherein the first-stage sampling is a rising edge sampling processing and the second-stage sampling is a falling edge sampling processing.

7. The signal sampling circuit of claim 5, wherein the fifth sampling circuit comprises a fifth flip-flop, a first NOT gate, and a sixth flip-flop; wherein
an input end of the fifth flip-flop is connected with the to-be-processed even chip select signal, a clock end of the fifth flip-flop is connected with the first odd clock signal, an output end of the fifth flip-flop is used for outputting the first odd chip select sampling signal, an input end of the sixth flip-flop is connected with the output end of the fifth flip-flop, an input end of the first NOT gate is connected with the first odd clock signal, an output end of the first NOT gate is connected with a clock end of the sixth flip-flop, and an output end of the sixth flip-flop is used for outputting the second odd chip select sampling signal; and
the sixth sampling circuit comprises a seventh flip-flop, a second NOT gate and an eighth flip-flop; wherein
an input end of the seventh flip-flop is connected with the to-be-processed odd chip select signal, a clock end of the seventh flip-flop is connected with the first even clock signal, an output end of the seventh flip-flop is used for outputting the first even chip select sampling signal, an input end of the eighth flip-flop is connected with the output end of the seventh flip-flop, an input end of the second NOT gate is connected with the first even clock signal, an output end of the second NOT gate is connected with a clock end of the eighth flip-flop, and an output end of the eighth flip-flop is used for outputting the second even chip select sampling signal.

8. The signal sampling circuit of claim 5, wherein the first logic circuit comprises:
a first OR gate, configured to perform OR operation on the first odd chip select sampling signal and the second odd chip select sampling signal to obtain an intermediate odd signal; and
a first AND gate, configured to perform AND operation on the intermediate odd signal and the first odd clock signal to obtain the odd chip select clock signal; and
wherein the second logic circuit comprises:
a second OR gate, configured to perform OR operation on the first even chip select sampling signal and the second even chip select sampling signal to obtain an intermediate even signal; and
a second AND gate, configured to perform AND operation on the intermediate even signal and the first even clock signal to obtain the even chip select clock signal.

9. The signal sampling circuit of claim 5, wherein the chip select control circuit comprises:
a third logic circuit, configured to perform sampling and inverting on the to-be-processed odd chip select signal by using the first even clock signal to obtain an intermediate even chip select signal, and perform logical operations on the intermediate even chip select signal, the to-be-processed even chip select signal and the to-be-processed even command signal to obtain an even command decoding signal; and
a fourth logic circuit, configured to perform sampling and inverting on the to-be-processed even chip select signal by using the first odd clock signal to obtain an intermediate odd chip select signal, and perform logical operations on the intermediate odd chip select signal, the to-be-processed odd chip select signal and the to-be-processed odd command signal to obtain an odd command decoding signal;
wherein the intermediate chip select signal comprises the intermediate even chip select signal and the intermediate odd chip select signal, and the command decoding signal comprises the even command decoding signal and the odd command decoding signal.

10. The signal sampling circuit of claim 9, wherein the third logic circuit comprises:
a seventh sampling circuit, configured to perform sampling and inverting on the to-be-processed odd chip select signal by using the first even clock signal to obtain the intermediate even chip select signal;
a third AND gate, configured to perform AND operation on the intermediate even chip select signal and the to-be-processed even chip select signal to obtain a target even chip select signal; and
a fourth AND gate, configured to perform AND operation on the target even chip select signal and the to-be-processed even command signal to obtain the even command decoding signal; and
wherein the fourth logic circuit comprises:
an eighth sampling circuit, configured to perform sampling and inverting on the to-be-processed even chip select signal by using the first odd clock signal to obtain the intermediate odd chip select signal;
a fifth AND gate, configured to perform AND operation on the intermediate odd chip select signal and the to-be-processed odd chip select signal to obtain a target odd chip select signal; and
a sixth AND gate, configured to perform AND operation on the target odd chip select signal and the to-be-processed odd command signal to obtain the odd command decoding signal.

11. The signal sampling circuit of claim 10, wherein
the seventh sampling circuit comprises a ninth flip-flop and a third inverter, an input end of the ninth flip-flop is connected with the to-be-processed odd chip select signal, a clock end of the ninth flip-flop is connected with the first even clock signal, an output end of the ninth flip-flop is connected with an input end of the third inverter, and an output end of the third inverter is used for outputting the intermediate even chip select signal; and
the eighth sampling circuit comprises a tenth flip-flop and a fourth inverter, an input end of the tenth flip-flop is connected with the to-be-processed even chip select signal, a clock end of the tenth flip-flop is connected with the first odd clock signal, an output end of the tenth flip-flop is connected with an input end of the fourth inverter, and an output end of the fourth inverter is used for outputting the intermediate odd chip select signal.

12. The signal sampling circuit of claim 10, wherein the output sampling circuit comprises:
   a ninth sampling circuit, configured to perform sampling on the even command decoding signal by using the odd chip select clock signal to obtain a target odd command signal;
   a tenth sampling circuit, configured to perform sampling on the odd command decoding signal by using the even chip select clock signal to obtain a target even command signal; and
   a third OR gate, configured to perform OR operation on the target odd command signal and the target even command signal to obtain the target command signal.

13. The signal sampling circuit of claim 12, wherein
   the ninth sampling circuit comprises an eleventh flip-flop, an input end of the eleventh flip-flop is connected with the even command decoding signal, a clock end of the eleventh flip-flop is connected with the odd chip select clock signal, and an output end of the eleventh flip-flop is used for outputting the target odd command signal; and
   the tenth sampling circuit comprises a twelfth flip-flop, an input end of the twelfth flip-flop is connected with the odd command decoding signal, a clock end of the twelfth flip-flop is connected with the even chip select clock signal, and an output end of the twelfth flip-flop is used for outputting the target even command signal.

14. The signal sampling circuit of claim 5, wherein the initial chip select signal is a signal indicating that a target chip is selected, and the initial chip select signal is an active-low pulse signal; wherein
   when the initial chip select signal comprises one pulse and has a pulse width of the preset clock cycle, the target command signal obtained by the signal sampling circuit is a valid decoding signal and is a Command signal in a 5th Double Data Rate Dynamic Random Access Memory (DDR5 DRAM) chip, and the Command signal comprises a read command signal, a write command signal, a refresh command signal, a pre-charge command signal and an active command signal; and
   when the initial chip select signal comprises one pulse and has a pulse width of twice the preset clock cycle, the target command signal obtained by the signal sampling circuit is a valid decoding signal, and the target command signal is a Non-Target On-Die Termination (Non-Target ODT) Command signal in the DDR5 DRAM chip.

15. The signal sampling circuit of claim 13, wherein in a case where a pulse width of the initial chip select signal is twice the preset clock cycle,
   when the first chip select signal is sampled to be at a low level in a rising edge of an even clock cycle and to be at the low level in a rising edge of a next adjacent odd clock cycle, it is determined that both the even chip select clock signal and the odd chip select clock signal are valid pulse signals, and a first pulse of the even chip select clock signal is delayed by one preset clock cycle than a first pulse of the odd chip select clock signal; and it is determined that the target even chip select signal is an active-high pulse signal, to obtain the target command signal by performing sampling on the even command decoding signal based on the odd chip select clock signal;
   wherein the target command signal comprises one pulse and a pulse width of the pulse is twice the preset clock cycle, a rising edge of the first pulse of the odd chip select clock signal is used to generate a rising edge of the target command signal, and a rising edge of a second pulse of the odd chip select clock signal is used to generate a falling edge of the target command signal.

16. The signal sampling circuit of claim 13, wherein in a case where a pulse width of the initial chip select signal is twice the preset clock cycle,
   when the first chip select signal is sampled to be at a low level in a rising edge of an odd clock cycle and sampled to be at the low level in a rising edge of a next adjacent even clock cycle, it is determined that both the even chip select clock signal and the odd chip select clock signal are valid pulse signals, and a first pulse of the odd chip select clock signal is delayed by one preset clock cycle than a first pulse of the even chip select clock signal; and it is determined that the target odd chip select signal is an active-high pulse signal, to obtain the target command signal by performing sampling on the odd command decoding signal based on the even chip select clock signal;
   wherein the target command signal comprises one pulse and a pulse width of the pulse is twice the preset clock cycle, a rising edge of the first pulse of the even chip select clock signal is used to generate a rising edge of the target command signal, and a rising edge of a second pulse of the even chip select clock signal is used to generate a falling edge of the target command signal.

17. A semiconductor memory, comprising a signal sampling circuit, wherein the signal sampling circuit comprises:
   a signal input circuit, configured to determine a to-be-processed command signal and a to-be-processed chip select signal according to a first clock signal, a first chip select signal and a first command address signal, a clock cycle of the first clock signal being twice a preset clock cycle;
   a clock processing circuit, configured to perform two-stage sampling and logical operation on the to-be-processed chip select signal according to the first clock signal to obtain a chip select clock signal, the chip select clock signal comprising two pulses and a pulse width of each of the two pulses being the preset clock cycle;
   a chip select control circuit, configured to perform sampling on the to-be-processed chip select signal according to the first clock signal to obtain an intermediate chip select signal, and perform logical operations on the intermediate chip select signal, the to-be-processed chip select signal and the to-be-processed command signal to obtain a command decoding signal; and
   an output sampling circuit, configured to perform sampling on the command decoding signal according to the chip select clock signal to obtain a target command signal.

18. The semiconductor memory of claim 17, wherein the semiconductor memory is a Dynamic Random Access Memory (DRAM) chip and conforms to a 5th Double Data Rate (DDR5) memory specification.

* * * * *